(12) United States Patent  
Shiino et al.

(10) Patent No.: US 8,976,597 B2
(45) Date of Patent: Mar. 10, 2015

(54) ELECTRICALLY REWRITEABLE NONVOLATILE SEMICONDUCTOR MEMORY DEVICE

(75) Inventors: Yasuhiro Shiino, Yokohama (JP); Eietsu Takahashi, Yokohama (JP); Koki Ueno, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 690 days.

(21) Appl. No.: 13/227,050

(22) Filed: Sep. 7, 2011

(65) Prior Publication Data

US 2012/0206972 A1 Aug. 16, 2012

(30) Foreign Application Priority Data

Feb. 15, 2011 (JP) ................. 2011-030185

(51) Int. Cl.
*G11C 11/34* (2006.01)
*G11C 16/04* (2006.01)
*G11C 16/16* (2006.01)
*G11C 16/34* (2006.01)

(52) U.S. Cl.
CPC .............. *G11C 16/16* (2013.01); *G11C 16/345* (2013.01); *G11C 16/3445* (2013.01)
USPC ............ 365/185.19; 365/185.22; 365/185.29; 365/185.3

(58) Field of Classification Search
None
See application file for complete search history.

(56) References Cited

U.S. PATENT DOCUMENTS 5,920,502 A 7/1999 Noda et al.
6,314,026 B1 11/2001 Satoh et al.
6,519,184 B2 * 2/2003 Tanaka et al. ............ 365/185.22
7,532,520 B2 * 5/2009 Yanagidaira et al. ..... 365/185.29
7,952,958 B2 * 5/2011 Yanagidaira et al. ..... 365/233.19
7,974,135 B2 7/2011 Nakamura
8,169,832 B2 * 5/2012 Sarin et al. ............... 365/185.22
8,498,163 B2 * 7/2013 Yang ......................... 365/185.29
2002/0008990 A1 1/2002 Satoh et al.
2002/0110019 A1 8/2002 Satoh et al.
2009/0251971 A1* 10/2009 Futatsuyama ............ 365/185.22

FOREIGN PATENT DOCUMENTS

JP 8-203286 8/1996
JP 10-222995 8/1998
JP 2000-236031 8/2000
JP 2002-319286 10/2002

(Continued)

OTHER PUBLICATIONS

U.S. Appl. No. 13/417,719, filed Mar. 12, 2012, Shiino, et al.
U.S. Appl. No. 13/424,788, filed Mar. 20, 2012, Ueno.

(Continued)

*Primary Examiner* — Kretelia Graham
(74) *Attorney, Agent, or Firm* — Oblon, McClelland, Maier & Neustadt, L.L.P.

(57) ABSTRACT

A control circuit executes an erase operation that includes an erase pulse application operation and an erase verify operation. The erase pulse application operation applies an erase pulse voltage to a memory cell to change the memory cell from a write state to an erase state. The erase verify operation applies an erase verify voltage to the memory cell to judge whether the memory cell is in the erase state or not. The control circuit changes conditions of execution of the erase verify operation when the number of times of executions of the erase pulse application operation in one erase operation reaches a first number.

12 Claims, 35 Drawing Sheets

(56) References Cited

FOREIGN PATENT DOCUMENTS

| | | |
|---|---|---|
| JP | 2008-47273 | 2/2008 |
| JP | 2009-301599 | 12/2009 |

OTHER PUBLICATIONS

U.S. Appl. No. 13/280,618, filed Oct. 25, 2011, Ueno, et al.

Office Action issued Jun. 18, 2013 in Japanese Patent Application No. 2011-030185 (with English translation).

* cited by examiner

Erase Pulse Application Operation

Erase Verify Operation $N_{NG} \leq N_{AL}$ ⇒ Completion

ELECTRICALLY REWRITEABLE NONVOLATILE SEMICONDUCTOR MEMORY DEVICE

CROSS-REFERENCE TO RELATED APPLICATIONS

This application is based upon and claims the benefit of priority from the prior Japanese Patent Application No. 2011-30185, filed on Feb. 15, 2011, the entire contents of which are incorporated herein by reference.

FIELD

Embodiments described in the present specification relate to an electrically rewritable nonvolatile semiconductor memory device.

BACKGROUND

NAND-type flash memory is known as an example of a conventional nonvolatile semiconductor memory device. A memory cell array in a NAND-type flash memory is configured having a plurality of NAND cell units arranged therein, each of the NAND cell units having a plurality of memory cells connected in series. One NAND cell unit includes a memory string configured from a plurality of memory cells connected in series and select gate transistors connected to the two ends of the memory string. The two ends of each of the NAND cell units are connected to a bit line and a source line. The control gates of the plurality of memory cells within the NAND cell unit are each connected to different word lines.

In NAND-type flash memory, the plurality of memory cells within one NAND cell unit are connected in series so as to share sources and drains. Moreover, the select gate transistors and their bit line contacts and source line contacts are shared by the plurality of memory cells in one NAND string. In addition, the shape of the element region of word lines or memory cells is close to a simple striped shape, hence making the NAND-type flash memory suited to miniaturization, and allowing a large capacity flash memory to be realized.

However, in the above-described NAND-type flash memory, the threshold voltage distribution indicating erase state gradually shifts in a negative direction thus giving rise to an over-erase state. When such an over-erase state occurs, there is an increase in stress on the memory cell itself that is subject to erase, thus hastening deterioration of the gate insulating film (sometimes referred to as tunnel insulating film) in the memory cell.

DETAILED DESCRIPTION

A nonvolatile semiconductor memory device in an embodiment described below comprises a memory cell array and a control circuit. The memory cell array is configured having a plurality of NAND cell units arranged therein. Each NAND cell unit is configured having a plurality of memory cells connected in series. Each memory cell is configured capable of storing an erase state in which data is erased from the memory cell and a write state in which data is written to the memory cell. The control circuit is configured to execute an erase operation that includes an erase pulse application operation and an erase verify operation. The erase pulse application operation is configured to apply an erase pulse voltage to the memory cell to change the memory cell from the write state to the erase state. The erase verify operation is configured to apply an erase verify voltage to the memory cell to judge whether the memory cell is in the erase state or not. The control circuit is configured such that, when the number of times of executions of the erase pulse application operation in one erase operation reaches a first number, the control circuit changes conditions of execution of the erase verify operation.

Next, embodiments of the nonvolatile semiconductor memory device are described below with reference to the drawings.

First Embodiment

Schematic Configuration

Figure 1:
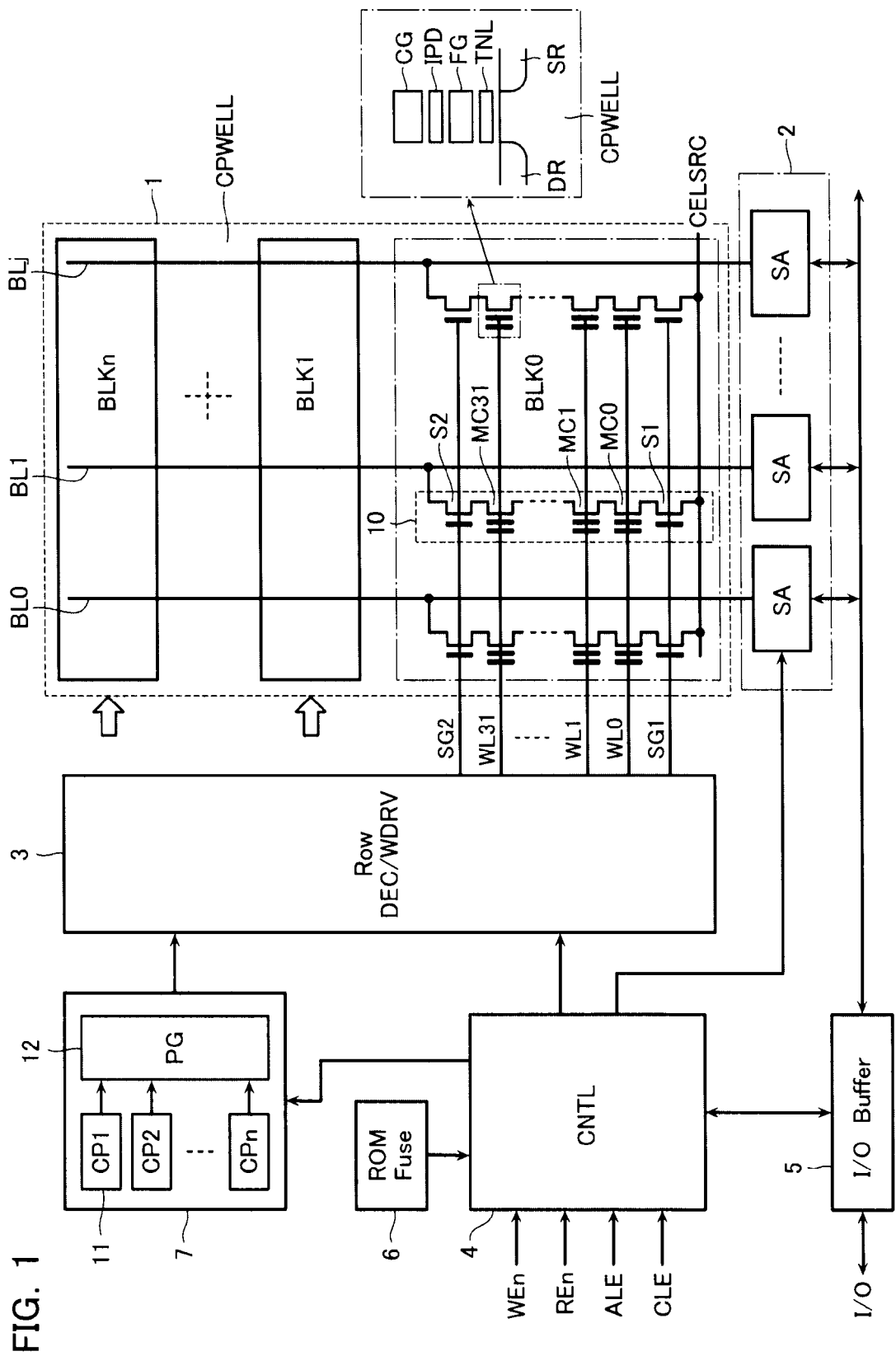
FIG. 1 is a block diagram of a nonvolatile semiconductor memory device according to a first embodiment.

FIG. 1 is a block diagram of a nonvolatile semiconductor memory device (NAND-type flash memory) according to a first embodiment. As shown in FIG. 1, the nonvolatile semiconductor memory device includes a memory cell array 1, a sense amplifier circuit 2, a row decoder 3, a controller 4, an input/output buffer 5, a ROM fuse 6, and a voltage generating circuit 7. The controller 4 may be disposed on a chip different from a chip disposed on the memory cell array 1.

The memory cell array 1 includes a plurality of NAND cell units 10 arranged in a matrix. One NAND cell unit 10 is configured by a plurality of memory cells MC (MC0, MC1, . . . , MC31) connected in series, and select gate transistors S1, S2 connected to the two ends of the plurality of memory cells MC.

Although not shown in FIG. 1, one memory cell MC may adopt the well-known configuration in which a gate insulating film TNL (tunnel insulating film) is formed between a drain DR and a source SR, a floating gate electrode FG acting as a charge storage layer is formed on the gate insulating film TNL, and a control gate electrode CG (gate electrode) is formed on the floating gate electrode FG via an inter-gate insulating film IPD. The gate electrode CG is connected to one of word lines WL.

The select gate transistor S1 has its source connected to a source line CELSRC, and the select gate transistor S2 has its drain connected to a bit line BL.

Control gates of the memory cells MC in a NAND cell unit 10 are each connected to different word lines WL (WL0, WL1, . . . , WL31). Gates of the select gate transistors S1, S2 are connected respectively to select gate lines SG1, SG2 parallel to the word lines WL. An aggregate of a plurality of the memory cells MC sharing one word line WL configures one page or two pages. An aggregate of a plurality of NAND cell units 10 sharing word lines WL and select gate lines SG1, SG2 configures a block BLK that forms a unit of data erase.

As shown in FIG. 1, the memory cell array 1 includes a plurality of blocks BLK (BLK0, BLK1, . . . , BLKn) arranged in a direction that the bit lines BL extend. The memory cell array 1 including these plurality of blocks BLK is formed in one cell well CPWELL of a silicon substrate.

Connected to the plurality of bit lines BL in the memory cell array 1 is the sense amplifier circuit 2. The sense amplifier circuit 2 includes a plurality of sense amplifiers SA. Each of the sense amplifiers SA is connected to a respective one of the bit lines BL and configures a page buffer for sensing read data and retaining write data. The row decoder 3 selects and drives the word lines WL and select gate lines SG1, SG2.

The data input/output buffer 5 performs transfer of data between the sense amplifier circuit 2 and external input/output terminals, and also receives command data and address data. The controller 4 receives external control signals such as a write enable signal WEn, a read enable signal REn, an address latch enable signal ALE, and a command latch enable signal CLE, to perform control of memory operations overall. Specifically, the controller 4 administers control of a read operation, a write operation, an erase operation, and so on, to be described later.

Specifically, the controller 4 includes a command interface, address retention circuit and transfer circuit, and so on, and judges whether supplied data is write data or address data. Based on the result of this judgment, write data is transferred to the sense amplifier circuit 2 and address data is transferred to the row decoder 3 or sense amplifier circuit 2. Moreover, the controller 4 performs sequence control of read, write and erase, control of applied voltage, and so on, based on the external control signals.

The voltage generating circuit 7 includes a plurality of boost circuits 11 and a pulse generating circuit 12. The boost circuits 11 may each be configured from well-known charge pump circuits CP1, CP2, . . . , CPn. The voltage generating circuit 7 is configured to switch the number of driven boost circuits 11 based on a control signal from the controller 4, to further control the pulse generating circuit 12 and thereby generate a desired pulse voltage.

Figure 2:
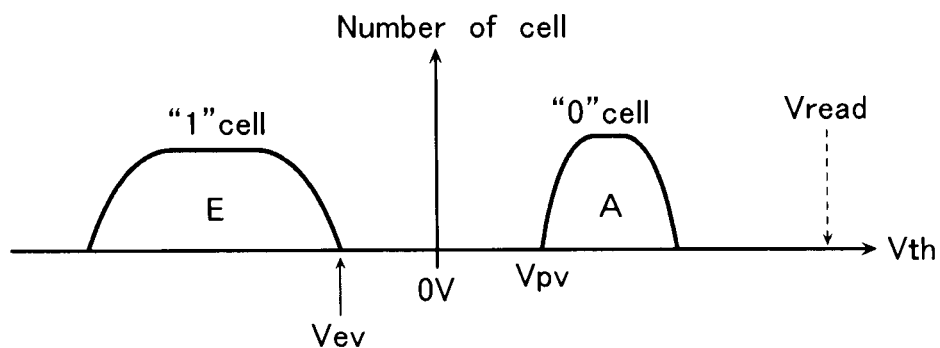
FIG. 2 is a view showing a relationship between threshold voltage and data stored in a memory cell MC according to the first embodiment.

FIG. 2 shows a relationship between data stored in the memory cell MC and threshold voltage distribution. FIG. 2 shows an example where binary storage is executed. As shown in FIG. 2, when a threshold voltage of a memory cell MC is included in a negative threshold voltage distribution E, that memory cell MC is defined as a "1" cell (erase state) holding logical "1" data. Moreover, when a threshold voltage of a memory cell MC is included in a positive threshold voltage distribution A, that memory cell MC is defined as a "0" cell (write state) holding logical "0" data.

In the present specification, an operation to change the memory cell MC from a "0" cell (write state) to a "1" cell (erase state) is referred to as an erase operation. Conversely, an operation to change the memory cell MC from a "1" cell (erase state) to a "0" cell (write state) is referred to as a write operation. In addition, an operation to judge to which of a plurality of threshold voltage distributions the threshold voltage of the memory cell MC belongs and thereby read data stored by the memory cell MC is defined as a read operation.

In the present specification, "write operation" means an operation that includes a write pulse application operation configured to apply a write pulse voltage for increasing the threshold voltage in a positive direction, and a write verify operation for judging whether the write operation has actually been completed by the write pulse application operation or not.

Moreover, in the present specification, "erase operation" means an operation that includes an erase pulse application operation configured to apply to the memory cell MC an erase pulse voltage for changing the threshold voltage of the memory cell MC, and an erase verify operation for judging whether the erase operation has actually been completed by the erase pulse application operation or not. In a NAND-type flash memory, the erase operation is usually performed in units of a block BLK.

Next, specific methods of the erase pulse application operation and erase verify operation executed during the erase operation are described with reference to FIGS. 3 and 4.

Erase Pulse Application Operation

Figure 3:
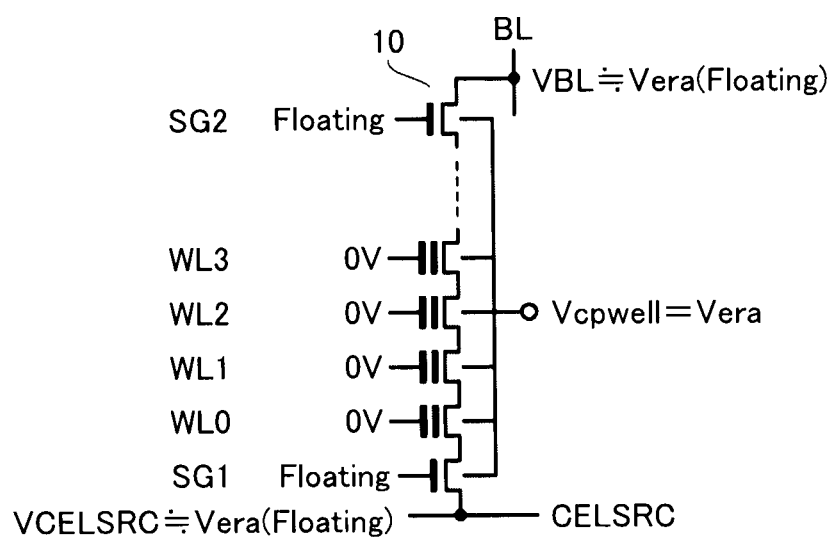
FIG. 3 is a view showing one example of a relationship of potentials during an erase pulse application operation focusing on one NAND cell unit 10 in the first embodiment.

FIG. 3 shows one example of a relationship of potentials during an erase pulse application operation focusing on one NAND cell unit 10. The erase pulse application operation is executed in a block BLK unit. A voltage Vpwell of the cell well CPWELL in the memory cells MC is set to an erase pulse voltage Vera (about 20 V-25 V), and a voltage of all word lines WL in a selected block BLK (hereinafter referred to as select block BLK) is set to 0 V. As a result, an FN tunnel current is generated, electrons in the floating gate of each of the memory cells MC are extracted to the cell well CPWELL side, and the threshold voltage of the memory cells MC lowers. At this time, the select gate lines SG1, SG2 are set to a floating state to prevent a gate oxidation film of the select gate transistors S1, S2 from being destroyed.

In addition, the bit line BL and source line CELSRC are also set to the floating state. Note that, as described later, the erase pulse voltage Vera is raised by increments of a step voltage $\alpha$ according to the result of the erase verify operation subsequent to the erase pulse application operation. Furthermore, the voltage Vera+$\alpha$ subsequent to that step-up is used to execute the erase pulse application operation again.

Erase Verify Operation

Figure 4:
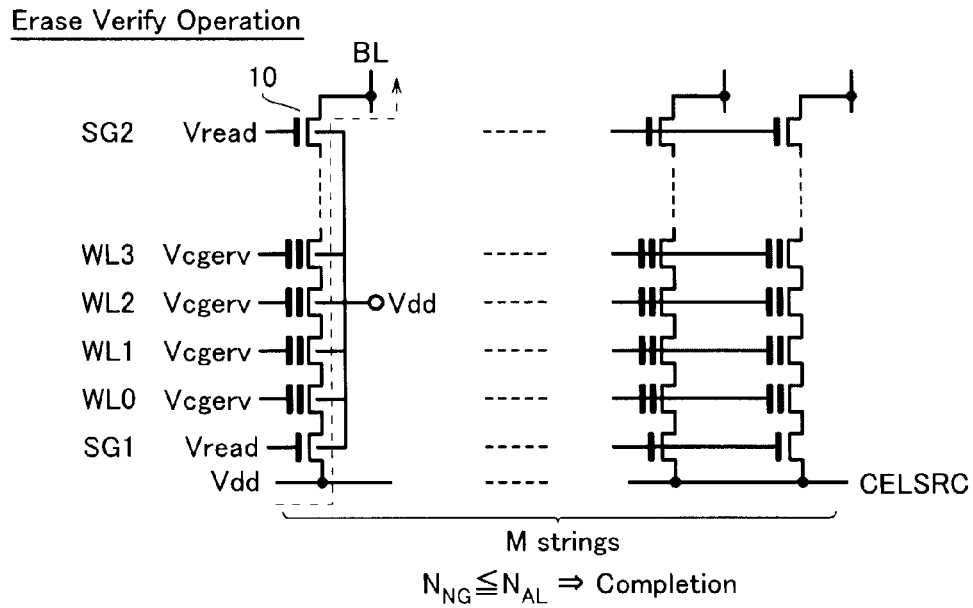
FIG. 4 is a view showing one example of a relationship of voltages applied to the NAND cell unit 10 during an erase verify operation in the first embodiment.

One example of a relationship of voltages applied to the NAND cell unit 10 during an erase verify operation is shown in FIG. 4. The source line CELSRC and cell well CPWELL are applied with a power supply voltage Vdd. In addition, all of the word lines WL in the select block BLK are applied with an erase verify voltage Vcgerv (0-1 V), and the select gate lines SG1, SG2 in the select block BLK are applied with an intermediate voltage Vread (approximately 3.0-4.5 V) that is higher than the power supply voltage Vdd. In this state, the voltage of the bit line BL differs according to whether all the memory cells MC in the NAND cell unit 10 are erased to "1" state or not. Accordingly, the sense amplifier circuit 2 is used to detect whether a current flows in the NAND cell unit 10 or not, and thereby judge whether all of the memory cells MC in one NAND cell unit are in the erase state or not. When it is judged in the erase verify operation that erase of all of the NAND cell units 10 in one block BLK has been completed, the erase operation is terminated. To reduce time of the erase operation, pseudo-pass system may be adopted. That is, when an erase verify operation is performed for M NAND cell units 10 in one block, and it is judged that the number $N_{NG}$ of NAND cell units 10 in which erase has not been performed is not more than a certain allowable number $N_{AL}$, the erase operation may be terminated, regarding that the erase operation therefor has been completed.

Standard Erase Operation

Figure 5:
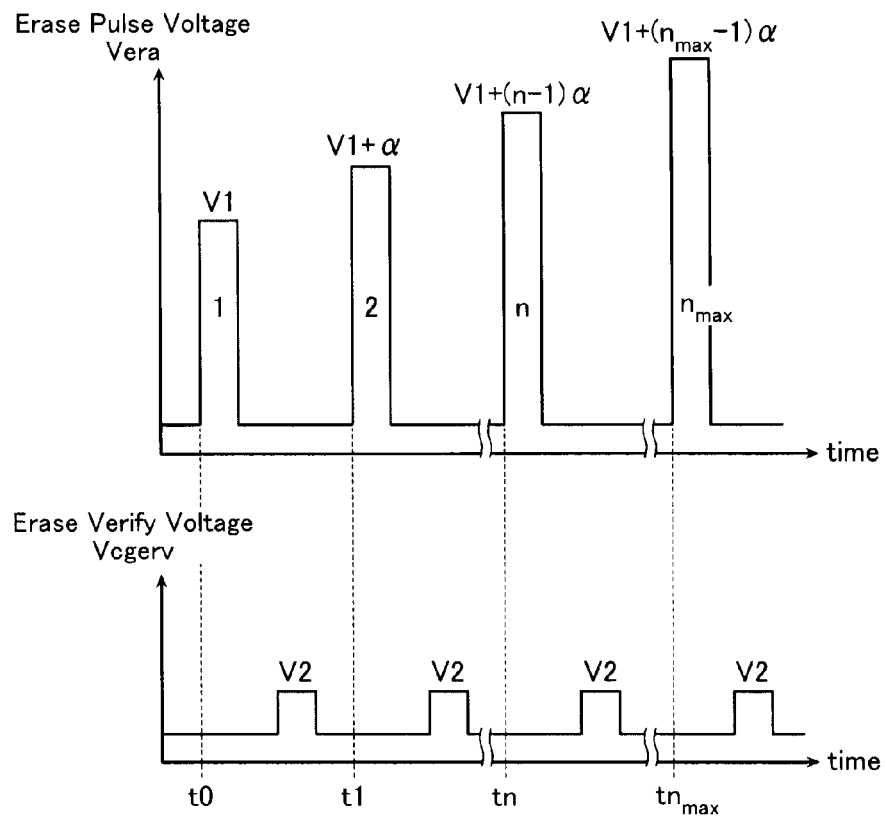
FIG. 5 is a conceptual view showing an execution procedure of an erase operation in a comparative example.

FIG. 5 is a conceptual view showing an execution procedure of a standard erase operation (comparative example). An erase operation is usually performed by executing alternately the above-described erase pulse application operation and erase verify operation. That is, as shown in FIG. 5, after an initial first time erase pulse application operation is performed at time t0, an erase verify operation is then performed. If completion of the erase operation is detected by this erase verify operation (when it is judged that the memory cells in the selected block or the NAND cell units are all in the erase state), the erase operation terminates. In the case that the erase operation has not been completed, the erase pulse application operation is executed again at time t1, after which the erase verify operation is again executed. In this way, the erase pulse application operation and the erase verify operation are repeated until the erase operation is completed, with, for example, $n_{MAX}$ times as a maximum number of repetition times.

The voltage Vera applied in the erase pulse application operation has its initial value set to V1. Then, as the number of repetition times of the erase pulse application operation increases, the voltage Vera is gradually stepped up to a large value (V1+$\alpha$, V1+2$\alpha$ . . . ). Furthermore, when the number of repetition times has reached the maximum value $n_{MAX}$ and the erase operation is judged not to have been completed even by an erase pulse application operation due to a maximum erase pulse voltage Vera=V1+($n_{MAX}$−1), that select block BLK is judged to be erase defective. Thereafter, the select block BLK is treated as a defective block.

Note that in FIG. 5, an example increasing by increments of a step-up value $\alpha$ is shown. However, the step-up value need not be fixed, and may be varied according to circumstances. This applies also to later described embodiments.

In addition, in FIG. 5, an example is described in which the erase pulse application operation and the erase verify operation are executed alternately one at a time. However, it is also possible, for example, for a plurality of erase pulse application operations to be performed multiple times continuously and for the erase verify operation between the plurality of erase pulse application operations to be omitted. This applies also to later described embodiments.

In the erase operation as shown in FIG. 5, the following problem may arise. That is, in the erase operation in FIG. 5, the voltage value of the erase verify voltage Vcgerv applied to the control gate of the memory cells MC in the erase verify operation is set to a fixed value V2 irrespective of the number of repetition times of the erase pulse application operation. However, when this erase verify voltage Vcgerv is set to a fixed value, then, as the number of times of execution of the write operation and erase operation increases, an over-erase state occurs in which the threshold voltage distribution E indicating the erase state shifts gradually in a negative direction. The presence of memory cells in such an over-erase state causes fluctuations of the threshold voltage distribution due to interference with adjacent memory cells, thereby adversely affecting reliability of data. Therefore, to prevent occurrence of this over-erase state, the erase operation in the present embodiment is executed using the procedure as in FIG. 6.

Erase Operation in First Embodiment

Figure 6:
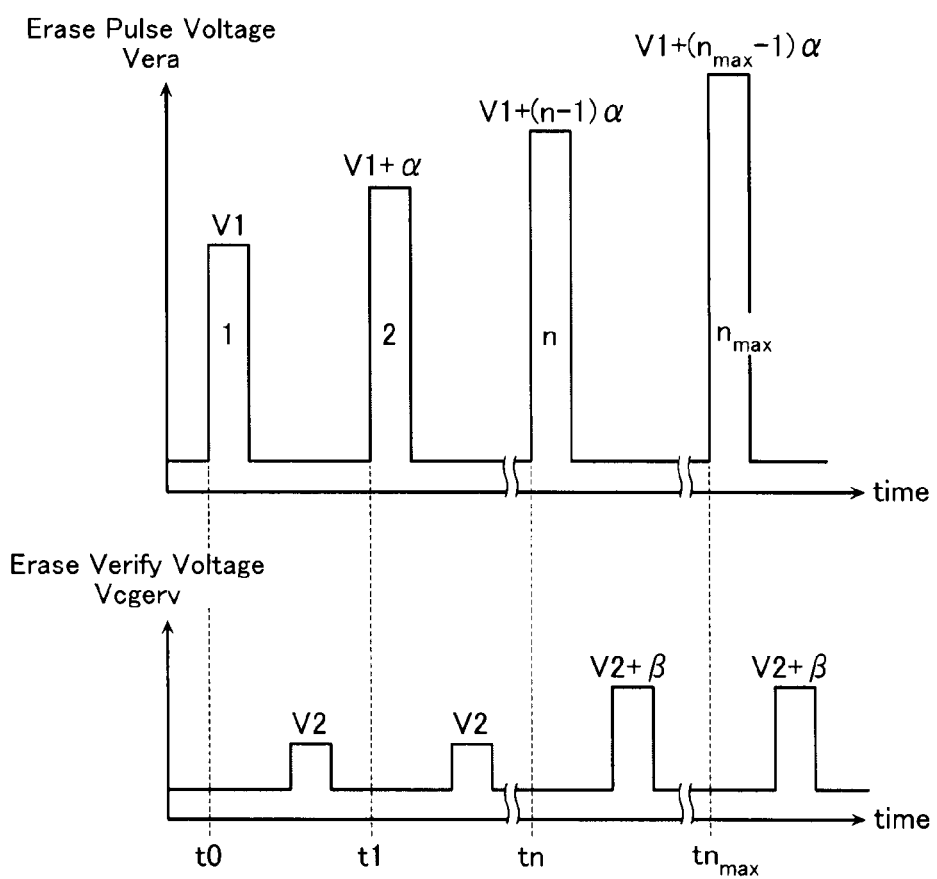
FIG. 6 shows schematically an erase operation according to the first embodiment.

A general outline of the erase operation according to the first embodiment is described with reference to FIG. 6. As shown in FIG. 6, as an example, the controller 4 executes the erase pulse application operation and the erase verify operation alternately one at a time, and repeats the erase pulse application operation and the erase verify operation until completion of the erase operation is detected by the erase verify operation. The value of the erase pulse voltage Vera in the erase pulse application operation increases gradually similarly to in FIG. 5.

However, in this embodiment, when the number of times of executions i of the erase pulse application operation has reached a number n, the value of the erase verify voltage Vcgerv is raised from previous voltage V2 to V2+β. The number n is less than the maximum allowable number $n_{MAX}$ of the erase pulse application operation.

Figure 7:
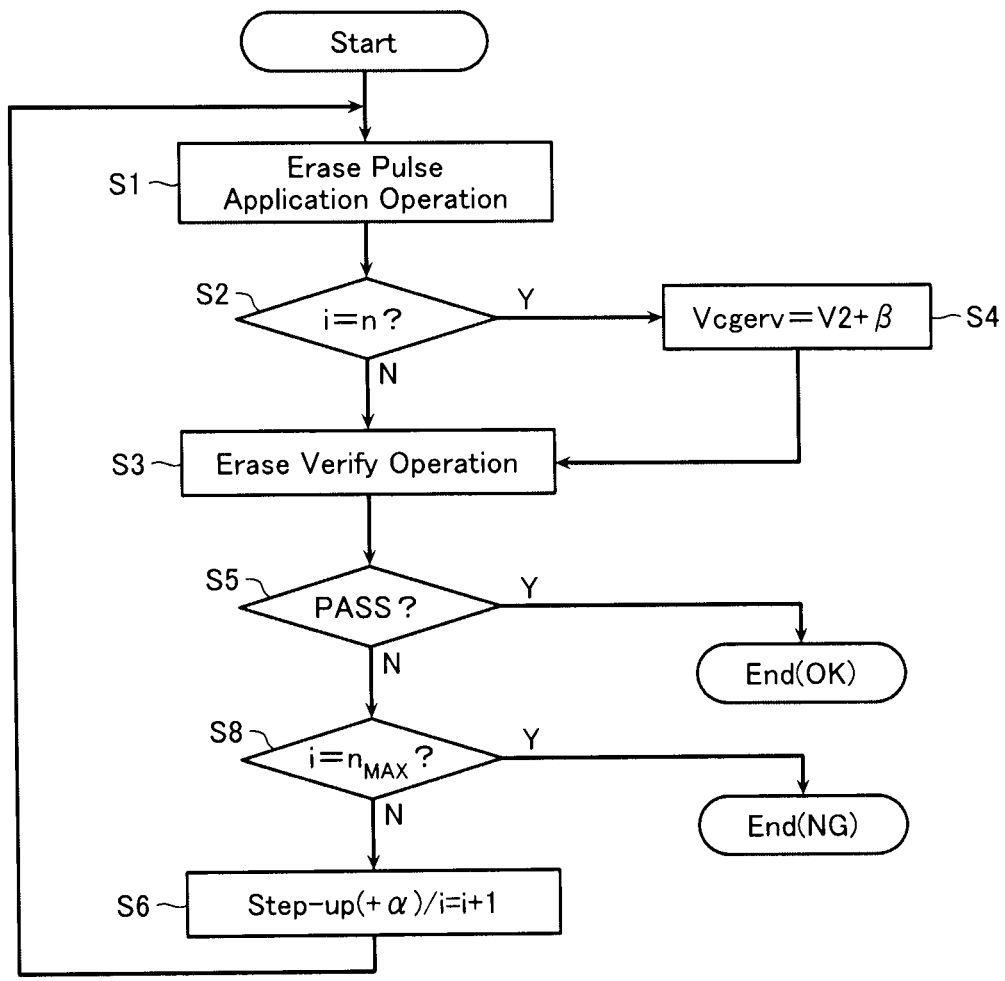
FIG. 7 is a flowchart showing specifically an execution procedure of the erase operation according to the first embodiment.

FIG. 7 is a flowchart showing specifically an execution procedure of the erase operation shown in FIG. 6. The controller 4 initially sets the erase pulse voltage Vera to the voltage V1 and the erase verify voltage Vcgerv to the voltage V2, and executes the erase pulse application operation (S1).

Subsequently, it is judged whether the number of times of executions i of the erase pulse application operation during one erase operation has reached n times or not (S2). If the number of times of executions i of the erase pulse application operation has not reached n times (N of S2), the erase verify voltage Vcgerv is set to the voltage V2 and the erase verify operation is executed (S3). On the other hand, if the number of times of executions i of the erase pulse application operation has reached n times (Y of S2), the erase verify voltage Vcgerv is changed from the voltage V2 to the voltage V2+β (S4), after which the n-th time erase verify operation is executed (S3). In the case it is judged by the n-th time erase verify operation that the erase operation has been completed (PASS) (Y of S5), the erase operation is terminated. On the other hand, in the case that the erase operation is not judged to have been completed (N of S5), the erase pulse voltage Vera is increased by an amount of a step-up value α (S6) and the erase pulse application operation is executed again (S1). Subsequently, the erase pulse application operation and the erase verify operation are repeated until the number of times of executions i has reached the maximum allowable number $n_{MAX}$ (N of S8). When the number of times of executions i has reached the maximum allowable number $n_{MAX}$ and the erase operation has not been completed (Y of S8), the erase operation is terminated as a fail (NG).

Now, there is a high possibility that a memory cell that does not attain a "PASS" verify judgment even in a state where the erase pulse voltage Vera is raised (hereinafter referred to as an "object-of-judgment-relaxation memory cell") has a gentle inclination of I-V curve dynamic characteristic compared to a memory cell other than an object-of-judgment-relaxation memory cell. For example, it is conceivable that an object-of-judgment-relaxation memory cell occurs due to process variations and so on. That is, although the object-of-judgment-relaxation memory cell has not attained a "PASS" verify judgment, the number of electrons present in the floating gate electrode of the memory cell is of a similar level to that of a memory cell that has attained a "PASS" verify judgment. If this object-of-judgment-relaxation memory cell is judged using an ordinary verify voltage, it becomes an over-erase memory cell that interferes greatly with adjacent memory cells.

On the other hand, reducing the value of the voltage α or shortening the time that the erase pulse voltage is applied may also be considered. However, in this method, judgment criteria are not relaxed, and it is therefore not possible to avoid the object-of-judgment-relaxation memory cell becoming an over-erase memory cell. Furthermore, time required for the erase operation becomes longer.

Therefore, in the first embodiment, over-erase memory cells are prevented from occurring by relaxing the erase verify judgment criteria, rather than by changing the erase pulse voltage. In addition, when the number of times of the write operation/erase operation is small, the erase pulse voltage V1 is sometimes adjusted to enable erase by applying the erase pulse voltage once. This case is termed "fresh cell single time erase adjustment". When fresh cell single time erase adjustment is performed, the number of times the erase pulse voltage is applied being two or more times means that electrons are trapped in the tunnel insulating film of the memory cell by the write operation/erase operation.

Figure 8:
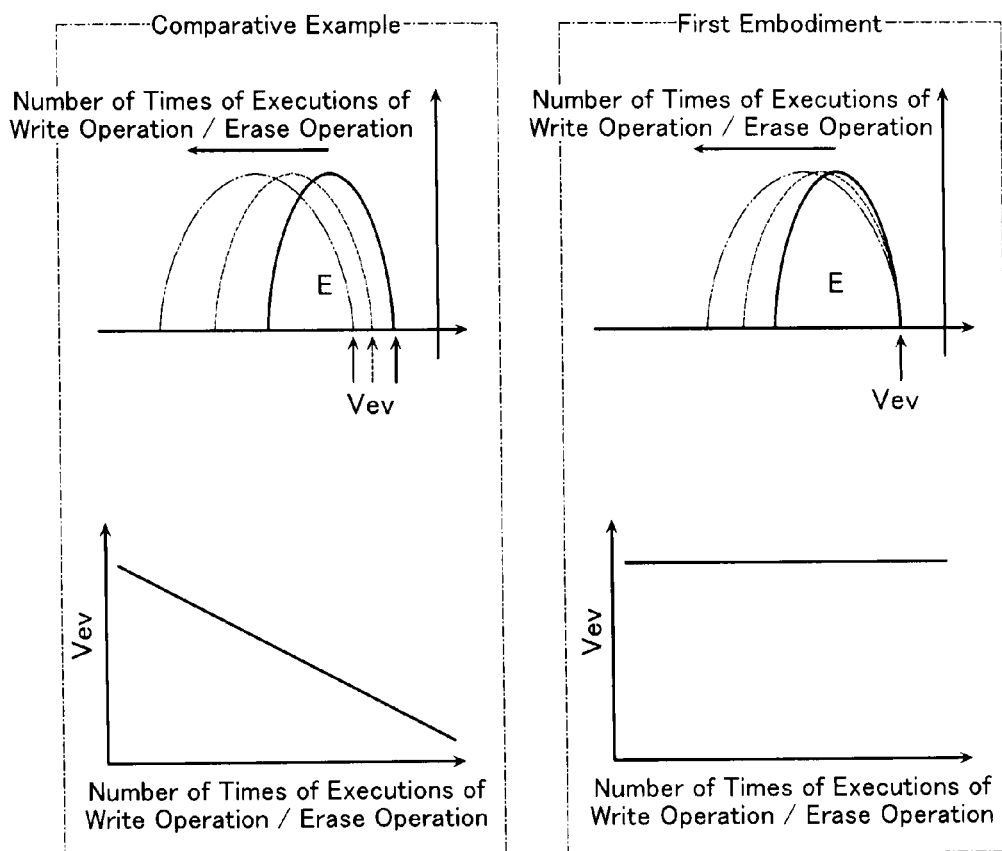
FIG. 8 is a view showing an advantage of the first embodiment.

FIG. 8 describes an advantage of the present embodiment due to the number of times of executions of the write operation/erase operation being increased. If the erase verify voltage Vcgerv is fixed at the value V2 as in the comparative example of FIG. 5, the judgment criteria of erase operation completion in the erase verify operation remain fixed. In this case, the upper limit value Vev of the threshold voltage distribution E indicating the erase state shifts substantively in the negative direction as the number of times of executions of the write operation/erase operation increases.

This results from the fact that when the number of times of executions of the write operation/erase operation increases, electrons are trapped in the tunnel insulating film of the memory cell and the inclination of the I-V curve dynamic characteristic of the memory cell becomes gentle. That is, there is a high possibility that a memory cell in which the number of times of executions of the write operation/erase operation is large becomes an over-erase memory cell. That is, when fresh cell single time erase adjustment is performed and when the number of times the erase pulse voltage is applied is two or more times, there is a high possibility of over-erase memory cells occurring.

Therefore, when the number of times of executions i of the erase pulse application operation executed in one erase operation exceeds n, the erase verify voltage Vcgerv is raised from, for example, previous voltage V2 to V2+β. That is, in the first embodiment, the number of times of executions of the write operation/erase operation may increase, thereby making erase of the memory cell more difficult, and the number of times of the erase pulse application operation required in one erase operation may be the number n or more. In this case, the erase verify voltage Vcgerv in the erase verify operation is raised (for example from V2 to V2+β). As a result, the judgment criteria for whether erase has been completed or not are relaxed. That is, although the upper limit value Vev of the threshold voltage distribution E that indicates the erase state shifts substantively in the negative direction, shift in the positive direction is performed.

As a result, over-erase of the memory cells MC can be suppressed and the upper limit value Vev of the threshold voltage distribution E indicating the erase state can be maintained substantially constant irrespective of the number of times of executions of the write operation/erase operation.

Moreover, when the number of times of the write operation/erase operation is small, the write verify judgment criteria are not relaxed. Accordingly, the possibility of the upper skirt of the threshold distribution of the memory cell in the erase state being raised is small.

When fresh cell single time erase adjustment is performed, deterioration of the tunnel insulating film in the memory cell can be judged by the number of times of executions of the erase pulse application operation. As a result, over-erase memory cells can be prevented from occurring without using a counter retaining the number of times of the write operation/ erase operation. In addition, the number of times of executions (n times) of the erase pulse application operation at which relaxation of the judgment criteria is commenced may also be changed. As a result, the judgment criteria may be relaxed only in the case where there is a high possibility of the tunnel insulating film in the memory cell being deteriorated. As a result, occurrence of over-erase memory cells MC in the case of many times of the write operation/erase operation can be effectively prevented without raising the upper skirt of the threshold distribution of memory cells in the erase state in the case of a few number of times of the write operation/erase operation.

Second Embodiment

Next, a nonvolatile semiconductor memory device in a second embodiment is described with reference to FIG. 9. A configuration of this nonvolatile semiconductor memory device in the second embodiment may be similar to that of the first embodiment. However, content of the erase operation in the second embodiment differs from that in the first embodiment.

Figure 9:
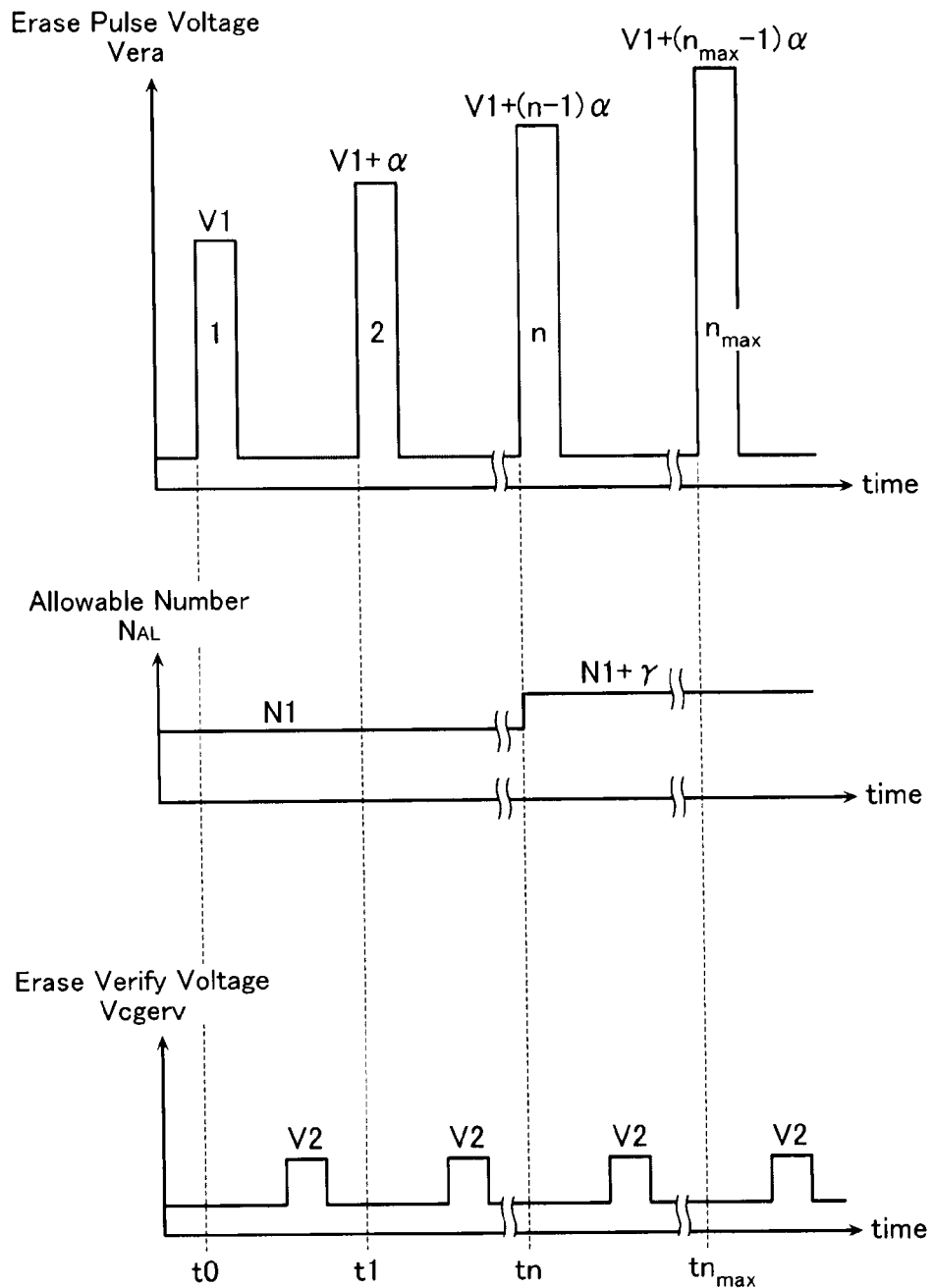
FIG. 9 shows schematically an erase operation according to a second embodiment.

FIG. 9 shows schematically the erase operation in the second embodiment. In the nonvolatile semiconductor memory device of the present embodiment, the pseudo-pass system is adopted. In the non-volatile semiconductor memory device according to the present embodiment, a pseudo-pass system is employed. That is, when an erase verify operation is performed for M NAND cell units 10 in one block, and it is judged that the number NNG of NAND cell units 10 in which erase has not been performed is not more than a certain allowable number $N_{AL}$, the erase operation therefor is regarded as having been completed. Now, the allowable number $N_{AL}$ is determined on the basis of the bit number redeemable by ECC. That is, a NAND cell unit in which an erase operation has not been completed is deemed as having been completed an erase operation, assuming that such a NAND cell unit 10 may be dealt as a normal NAND cell unit 10 by being repaired using ECC.

Furthermore, as shown in FIG. 9, when the number of times of executions i of the erase pulse application operation in one erase operation has reached the number n, the allowable number $N_{AL}$ is increased, for example, from an initial value N1 to N1+γ (the erase verify voltage Vcgerv is fixed at a constant value V2 irrespective of how many times the erase pulse application operation is performed in the one erase operation). As a result, the judgment criteria for completion of the erase operation in the erase verify operation are relaxed. In the first embodiment, when the number of times of executions i of the erase pulse application operation in one erase operation has reached the number n, an operation raising the erase verify voltage Vcgerv is performed, with the purpose of relaxing the judgment criteria for completion of the erase operation. A similar advantage to this can be obtained in the second embodiment.

Figure 10:
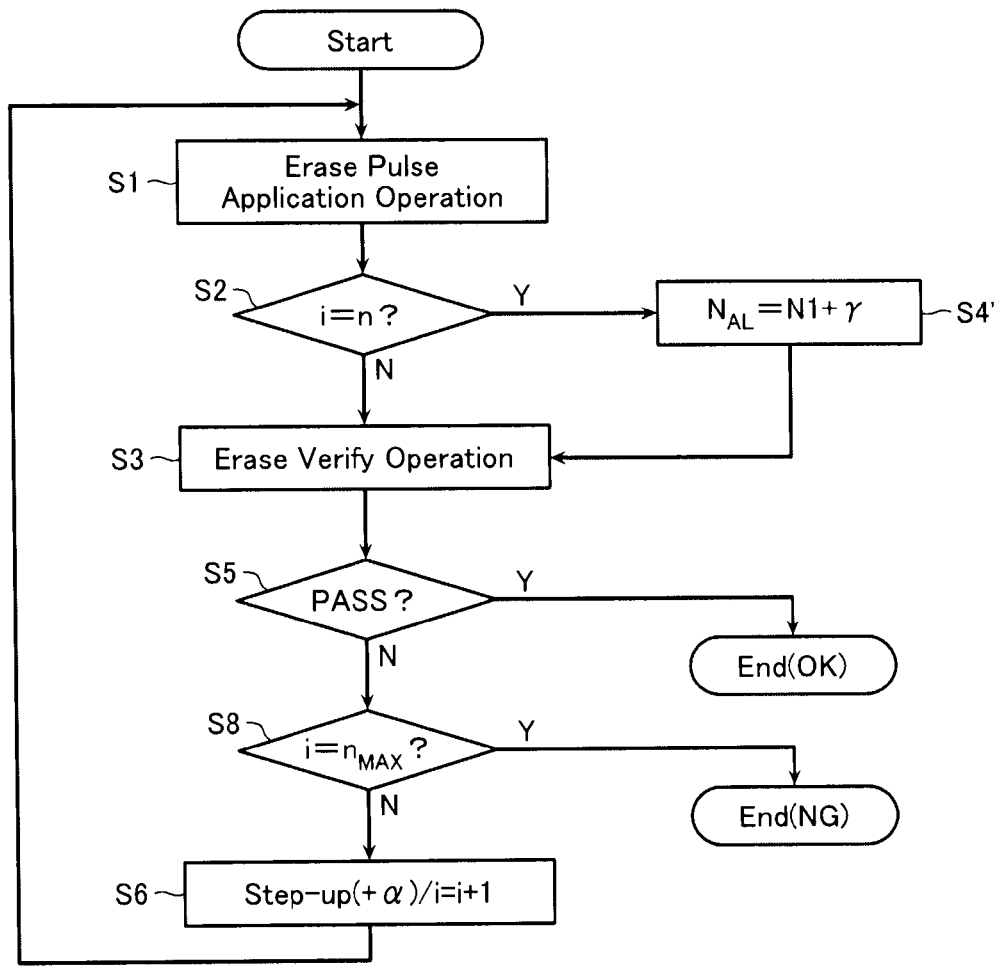
FIG. 10 is a flowchart showing specifically an execution procedure of the erase operation according to the second embodiment.

A specific procedure of the erase operation in the second embodiment is described using the flowchart of FIG. 10. The only difference between the second embodiment and the first embodiment is that in the second embodiment the size of the allowable number $N_{AL}$ switches from N1 to N1+γ.

In the second embodiment, over-erase memory cells can be prevented from occurring by increasing the allowable number $N_{AL}$ in place of relaxing the erase verify judgment criteria. That is, increasing the allowable number $N_{AL}$ results in a next erase pulse voltage not being applied. As a result, occurrence of memory cells in an over-erase state can be prevented.

In addition, even when fresh cell single time erase adjustment is performed, compensation can be effected by shifting the upper limit value Vev of the threshold voltage distribution E that indicates the erase state and that has shifted substantively in the negative direction, in the positive direction, similarly to as described in the first embodiment.

Third Embodiment

Next, a nonvolatile semiconductor memory device in a third embodiment is described with reference to FIG. 11. A configuration of this nonvolatile semiconductor memory device in the third embodiment may be similar to that of the first embodiment. However, content of the erase operation in the third embodiment differs from that in the first and second embodiments.

Figure 11:
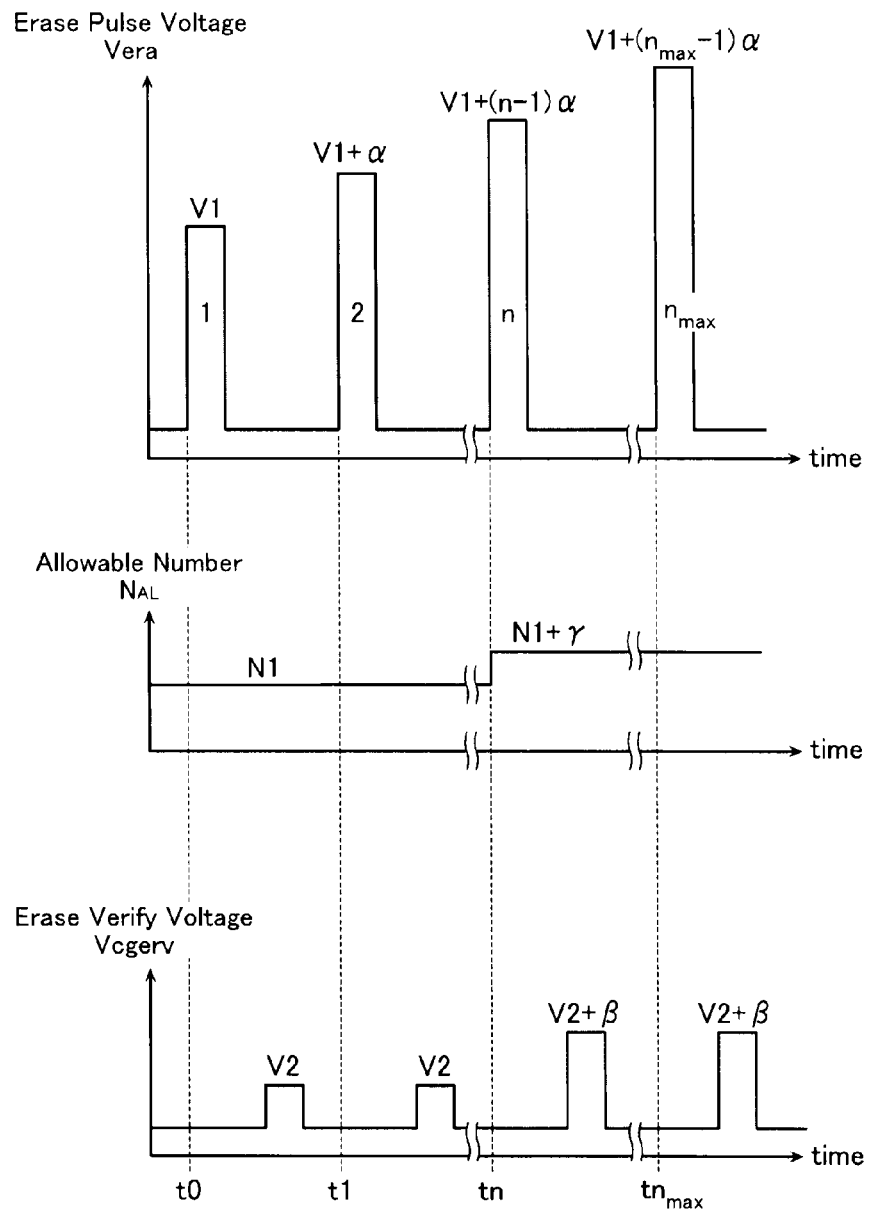
FIG. 11 shows schematically an erase operation according to a third embodiment.

FIG. 11 shows schematically the erase operation in the third embodiment. The nonvolatile semiconductor memory device in the present embodiment is a composite type of the first embodiment and the second embodiment. That is, when the number of times of executions i of the erase pulse application operation in one erase operation has reached the number n, the allowable number $N_{AL}$ is increased from the initial value N1 to N1+γ and the erase verify voltage Vcgerv also is raised from the voltage V2 to the voltage V2+β. As a result, the judgment criteria for completion of the erase operation in the erase verify operation are relaxed. This enables a similar advantage to be obtained in the third embodiment as in the first and second embodiments.

Figure 12:
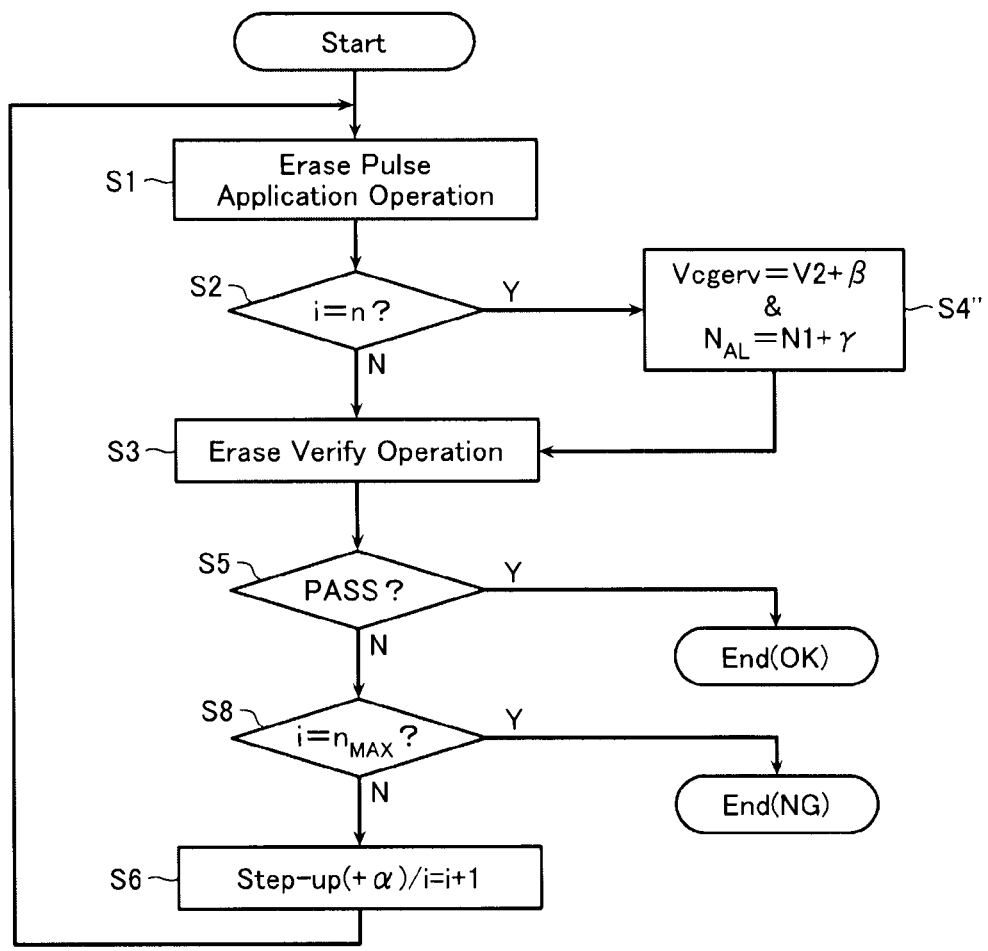
FIG. 12 is a flowchart showing specifically an execution procedure of the erase operation according to the third embodiment.

A specific procedure of the erase operation in the third embodiment is described using the flowchart of FIG. 12. The difference between the third embodiment and the first embodiment is step S4". In step S4", the size of the allowable number $N_{AL}$ is switched from N1 to N1+γ, and the erase verify voltage Vcgerv also is switched from the voltage V2 to the voltage V2+β. As a result, an advantage combining those of the first and second embodiments can be obtained.

First Modified Example of Third Embodiment

Figure 13A:
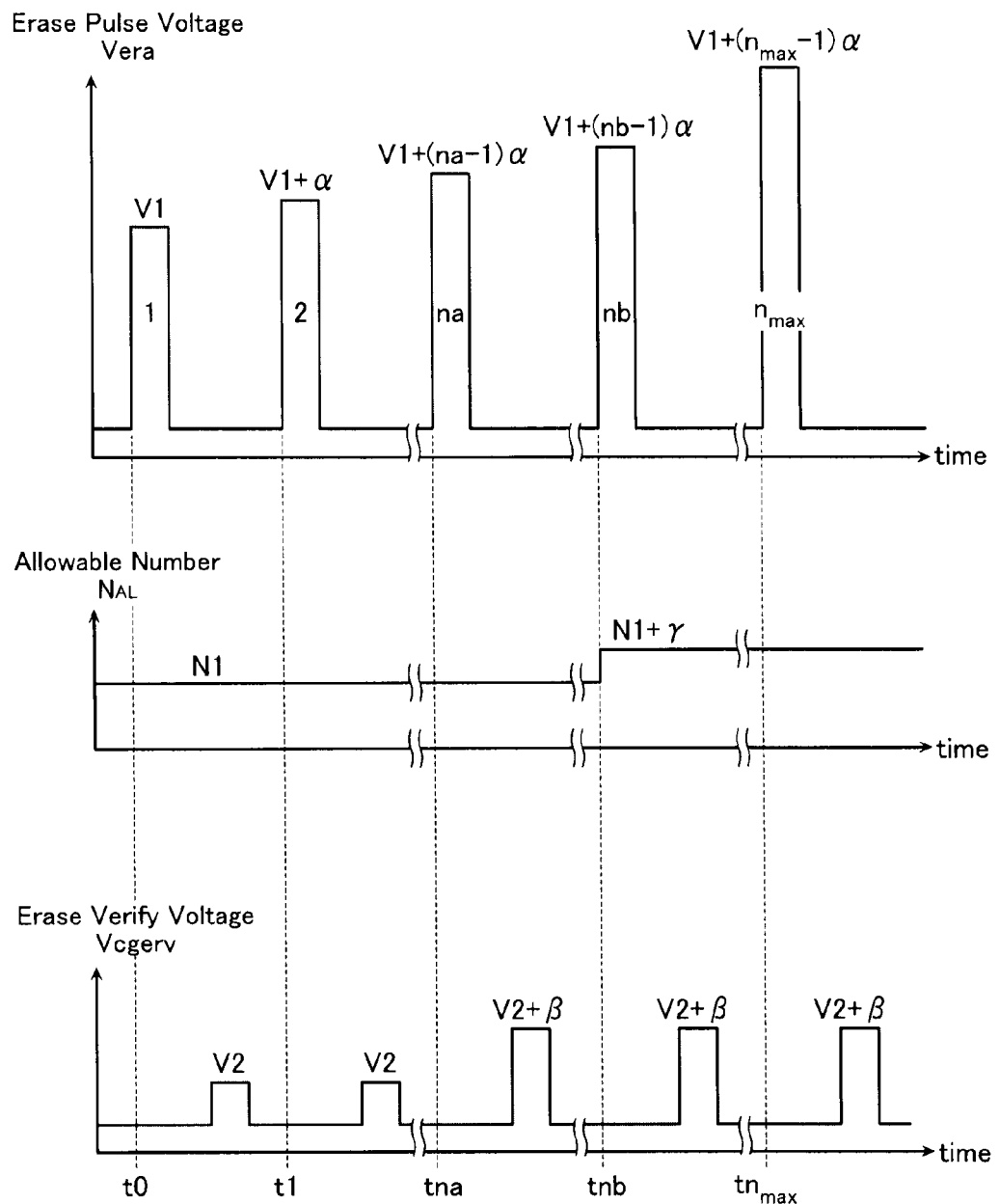
FIG. 13A shows schematically an erase operation according to a first modified example of the third embodiment.
Figure 13B:
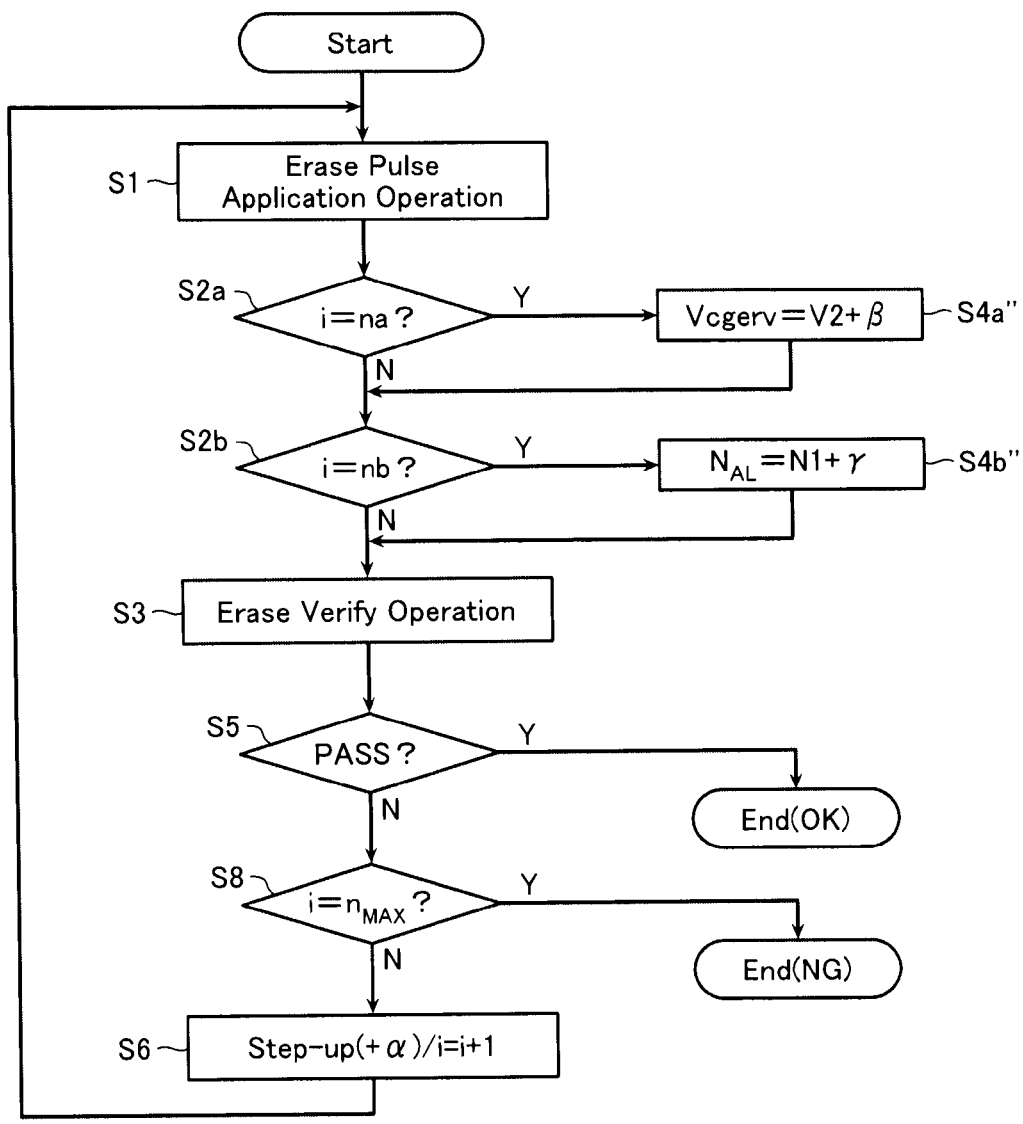
FIG. 13B is a flowchart showing specifically an execution procedure of the erase operation according to the first modified example of the third embodiment.

Next, a first modified example of the third embodiment is described with reference to FIGS. 13A and 13B. In the above-described third embodiment, when the number of times of executions i of the erase pulse application operation has reached the number n, the allowable number $N_{AL}$ is increased from the initial value N1 to N1+γ and the erase verify voltage Vcgerv also is raised from the voltage V2 to the voltage V2+β. In contrast, as shown in FIGS. 13A and 13B, in the first modified example of the third embodiment, when the number of times of executions i of the erase pulse application operation has reached a number na, the erase verify voltage Vcgerv is raised from the voltage V2 to the voltage V2+β (tna in FIG. 13A, and steps S2a, S4a" in FIG. 13B). As shown in FIGS. 13A and 13B, in the first modified example of the third embodiment, when the number of times of executions i of the erase pulse application operation has reached a number nb (nb>na), the allowable number $N_{AL}$ is increased from the initial value N1 to N1+γ (tnb in FIG. 13A, and steps S2b, S4b" in FIG. 13B). An advantage combining those of the first and second embodiments can be obtained even with such a first modified example of the third embodiment.

Second Modified Example of Third Embodiment

Figure 14:
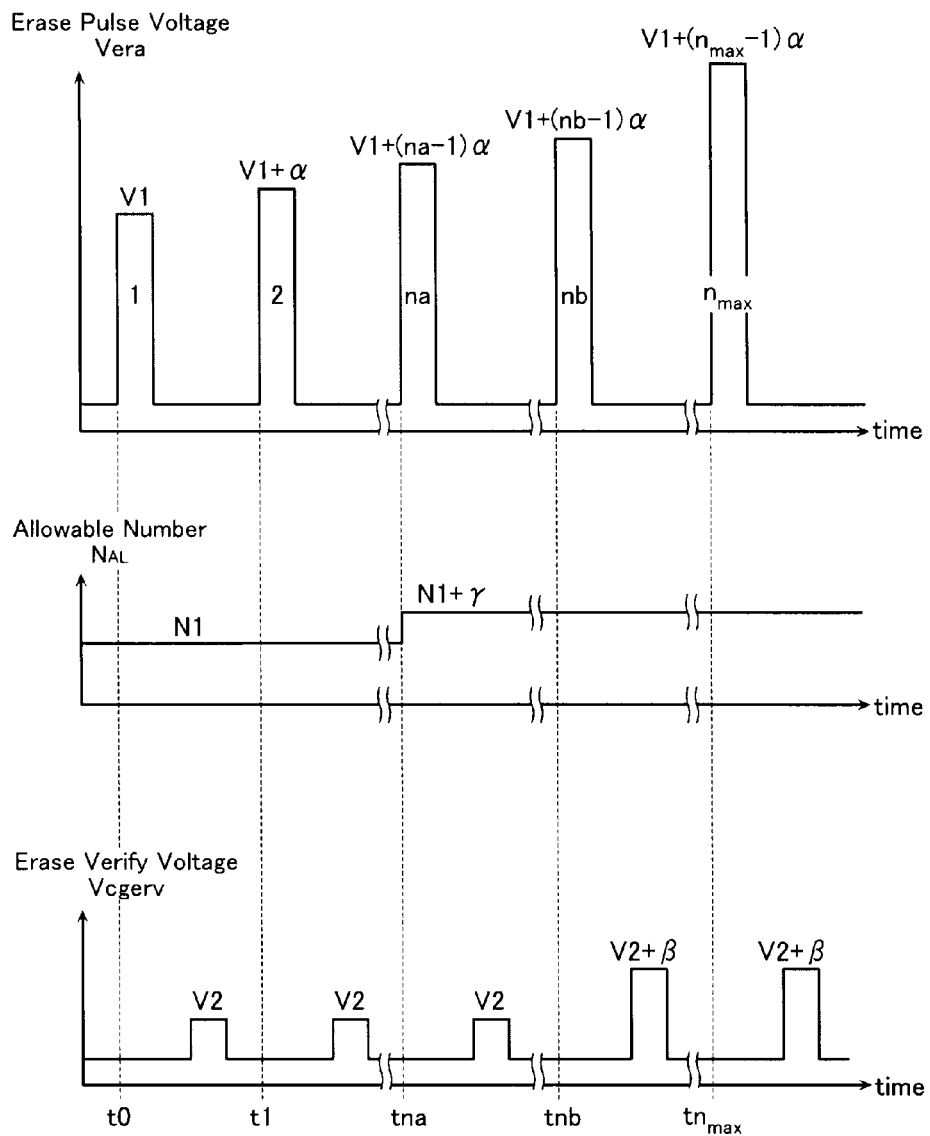
FIG. 14 shows schematically an erase operation according to a second modified example of the third embodiment.

Next, a second modified example of the third embodiment is described with reference to FIG. 14. As shown in FIG. 14, in the second modified example of the third embodiment, when the number of times of executions i of the erase pulse application operation has reached a number na, the allowable number $N_{AL}$ is increased from the initial value N1 to N1+γ (tna in FIG. 14). As shown in FIG. 14, in the second modified example of the third embodiment, when the number of times of executions i of the erase pulse application operation has reached a number nb (nb>na), the erase verify voltage Vcgerv is raised from the voltage V2 to the voltage V2+β (tnb in FIG. 14). That is, in the second modified example of the third embodiment, first, relaxation is performed on memory cells having a slow erase speed by raising the allowable number $N_{AL}$. If, in spite of that, in the second modified example of the third embodiment, the erase operation is not judged to have been completed (PASS) by the nb-th time erase verify operation, then the verify voltage Vcgerv is raised for relaxing the judgment criteria for judging whether erase in the entire selected block has been completed or not. That is, the second modified example of the third embodiment prioritizes relaxation of the allowable number $N_{AL}$ over relaxation of the verify voltage Vcgerv. As a result, the second modified example of the third embodiment allows the number of times of the erase operation to be effectively reduced, and enables the erase operation to be speeded up and occurrence of over-erase memory cells to be effectively prevented.

Fourth Embodiment

Next, a nonvolatile semiconductor memory device in a fourth embodiment is described with reference to FIG. 15. A configuration of this nonvolatile semiconductor memory device in the fourth embodiment may be similar to that of the first embodiment. However, content of the erase operation in the fourth embodiment differs from that in the aforementioned embodiments.

Figure 15:
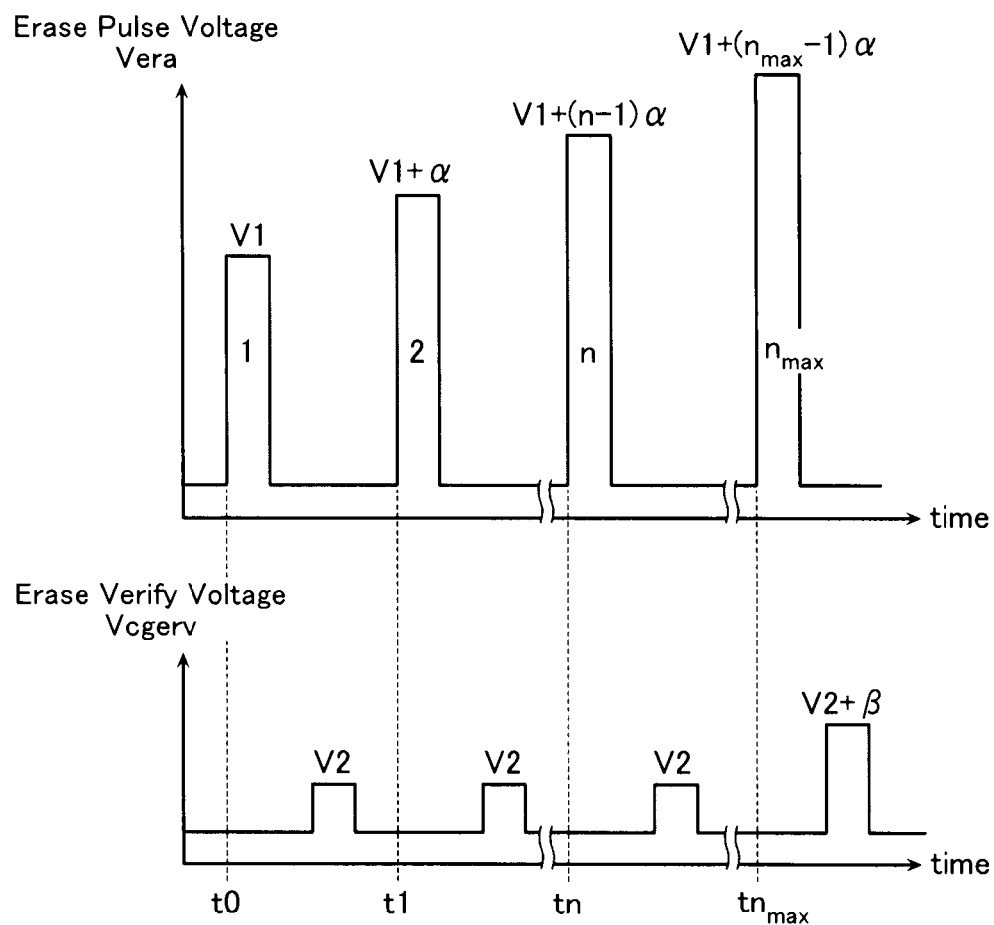
FIG. 15 shows schematically an erase operation according to a fourth embodiment.

FIG. 15 shows schematically the erase operation in the fourth embodiment. In the nonvolatile semiconductor memory device in the present embodiment, the erase verify voltage Vcgerv is raised from the voltage V2 to the voltage V2+β only when the number of times of executions i of the erase pulse application operation in one erase operation has reached the maximum allowable number $n_{MAX}$. As a result, only the judgment criteria for completion of the erase operation in the erase verify operation after the last erase pulse application operation are relaxed. This allows a similar advantage to that in the first and second embodiments to be obtained.

Figure 16:
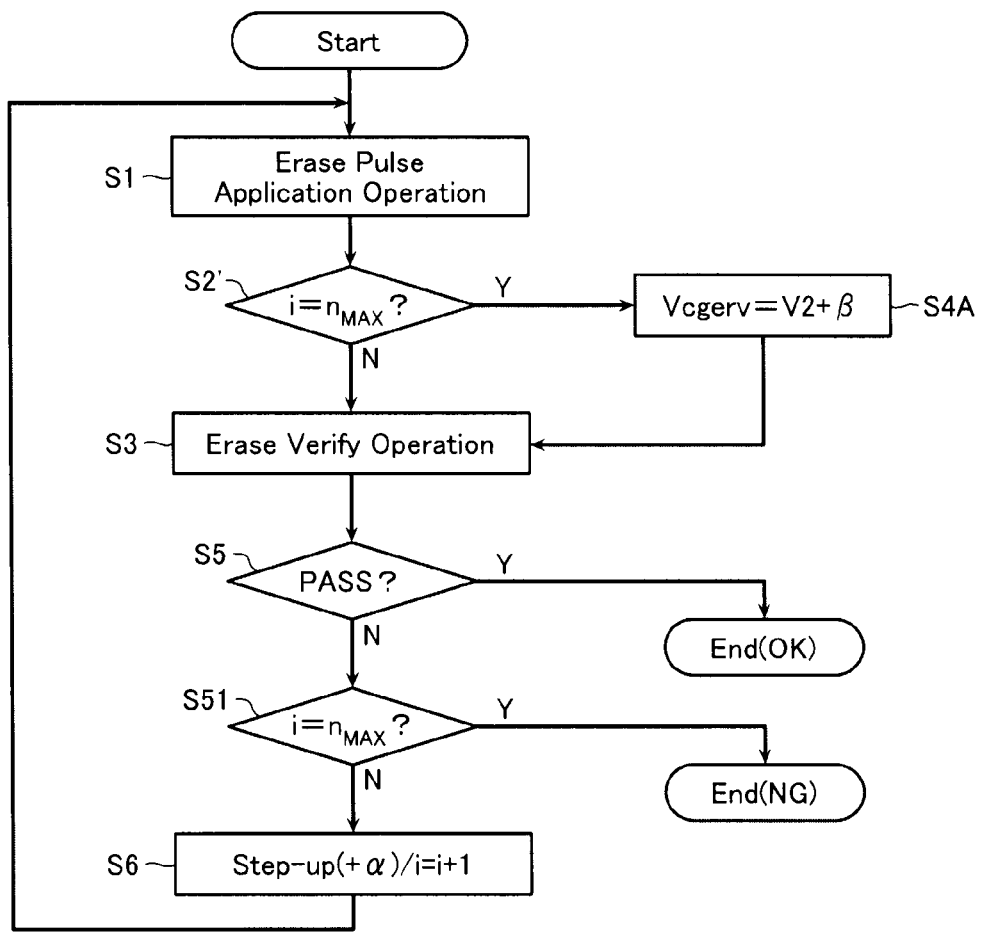
FIG. 16 is a flowchart showing specifically an execution procedure of the erase operation according to the fourth embodiment.

A specific procedure of the erase operation in the fourth embodiment is described using the flowchart of FIG. 16. The differences between the fourth embodiment and the first embodiment are steps S2', S4A, and S51. In step S2', it is judged whether the number of times of executions i of the erase pulse application operation has reached the maximum allowable number $n_{MAX}$ or not. And, if the judgment in step S2' is YES, then in step S4A the erase verify voltage Vcgerv is switched from the voltage V2 to the voltage V2+β.

When the erase operation is not completed even by the erase verify operation using the erase verify voltage Vcgerv=V2+β stepped up after the number of times of executions i of the erase pulse application operation has reached the maximum allowable number $n_{MAX}$, then the erase operation is terminated as a fail (Y in S2', S4A, S3, N in S5, Y in S51). Thereafter, the controller 4 treats the select block BLK as a defective block. In this way, relaxation of the judgment criteria can be performed not only in an intermediate erase pulse application operation, but also in the final erase pulse application operation.

Fifth Embodiment

Next, a nonvolatile semiconductor memory device in a fifth embodiment is described with reference to FIG. 17. A configuration of this nonvolatile semiconductor memory device in the fifth embodiment may be similar to that of the first embodiment. However, content of the erase operation in the fifth embodiment differs from that in the aforementioned embodiments.

Figure 17:
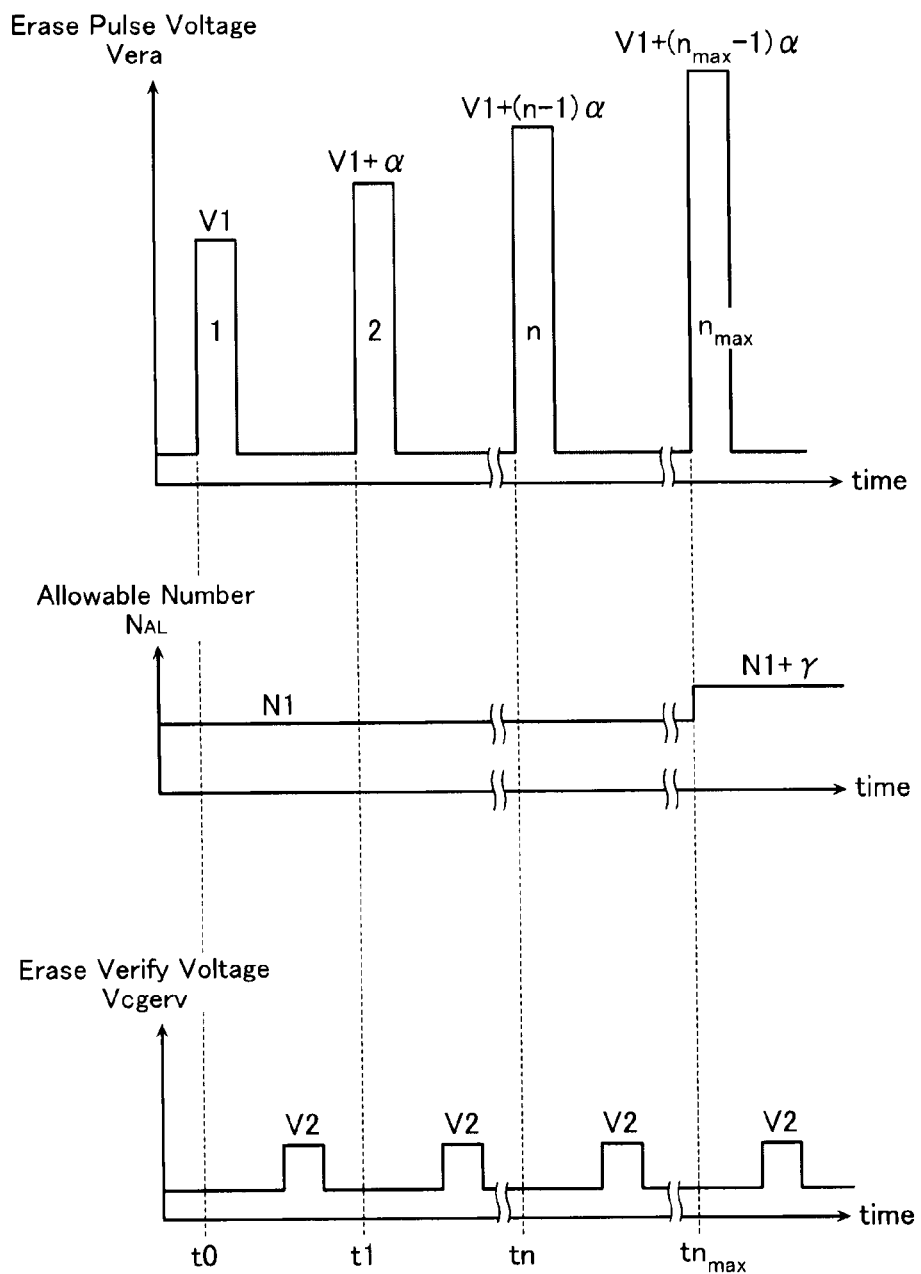
FIG. 17 shows schematically an erase operation according to a fifth embodiment.

FIG. 17 shows schematically the erase operation in the fifth embodiment. When the number of times of executions i of the erase pulse application operation in one erase operation has reached the maximum allowable number $n_{MAX}$, the aforementioned allowable number $N_{AL}$ is increased from the initial value N1 to N1+γ, for example (the erase verify voltage Vcgerv is fixed at a constant value V2 irrespective of what numbered time the erase pulse application operation is in the one erase operation). As a result, the judgment criteria for completion of the erase operation in the erase verify operation are relaxed only in the final erase verify operation subsequent to the final erase pulse application operation. In the fourth embodiment, an operation raising the erase verify voltage Vcgerv from the voltage V2 to the voltage V2+β is performed when the number of times of executions i of the erase pulse application operation in one erase operation has reached the maximum allowable number $n_{MAX}$, with the purpose of relaxing judgment criteria for completion of the erase operation. A similar advantage to this may be obtained also in the fifth embodiment.

Figure 18:
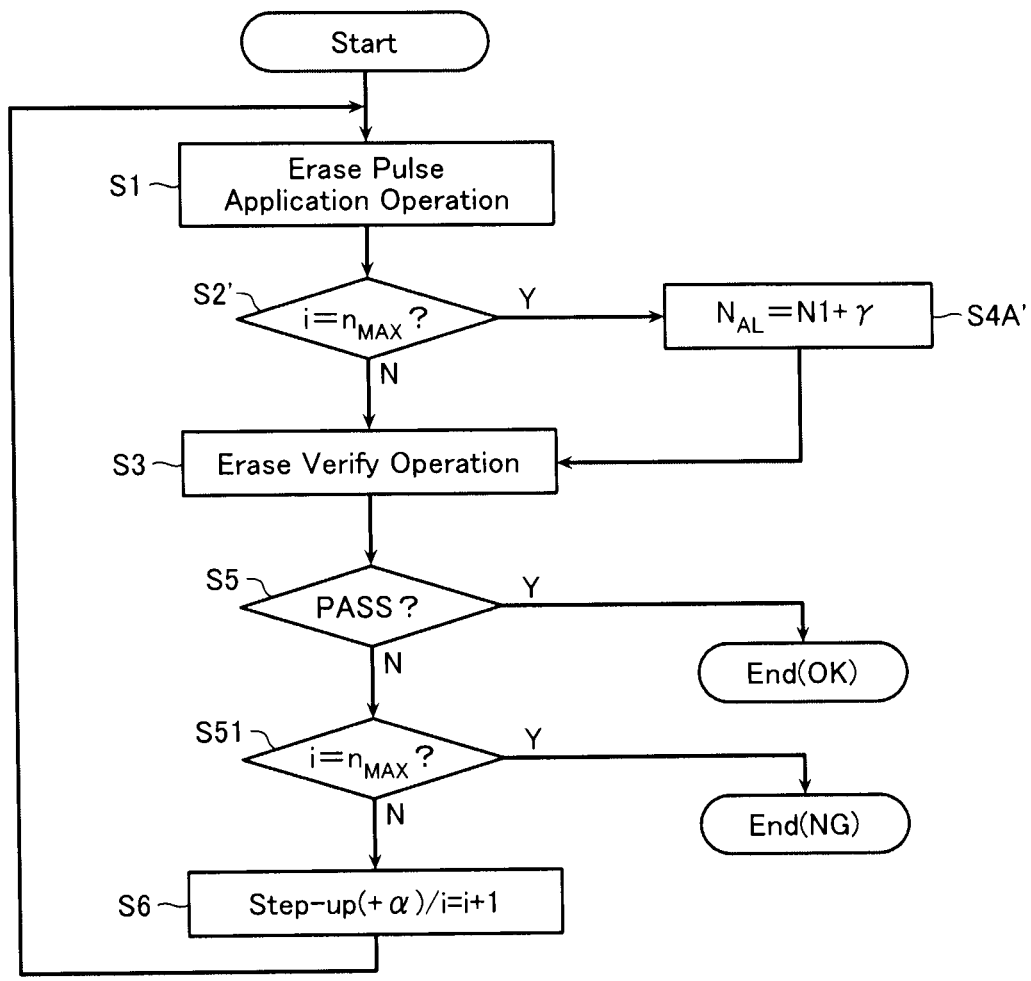
FIG. 18 is a flowchart showing specifically an execution procedure of the erase operation according to the fifth embodiment.

A specific procedure of the erase operation in the fifth embodiment is described using the flowchart of FIG. 18. The only difference between the fifth embodiment and the fourth embodiment is the size of the allowable number $N_{AL}$ being switched from N1 to N1+γ in step S4A'. Switching of the size of the allowable number $N_{AL}$ in this way can be performed not only in an intermediate erase pulse application operation, but also in the final erase pulse application operation.

Sixth Embodiment

Next, a nonvolatile semiconductor memory device in a sixth embodiment is described with reference to FIG. 19. A configuration of this nonvolatile semiconductor memory device in the sixth embodiment may be similar to that of the first embodiment. However, content of the erase operation in the sixth embodiment differs from that in the aforementioned embodiments.

Figure 19:
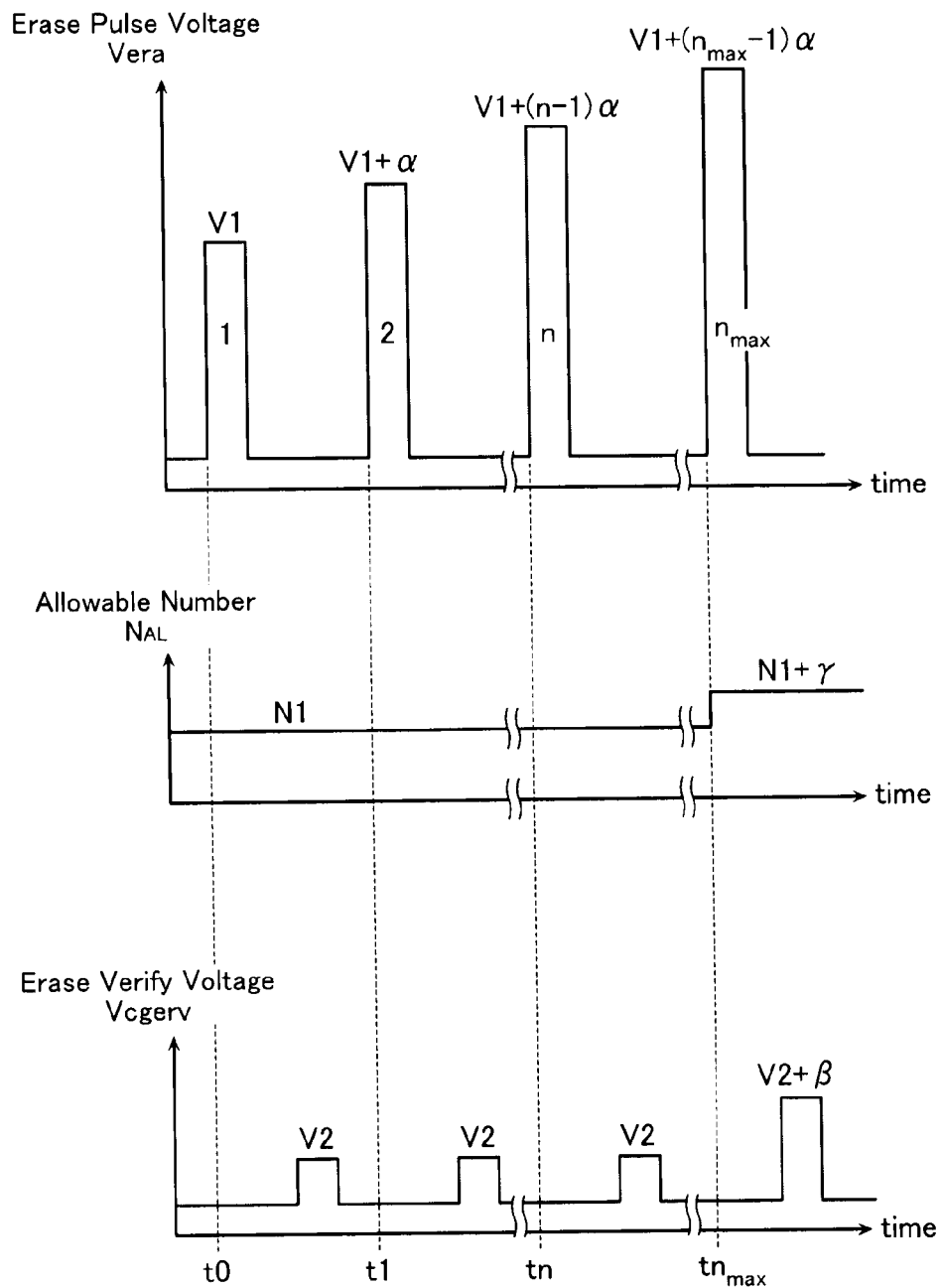
FIG. 19 shows schematically an erase operation according to a sixth embodiment.

FIG. 19 shows schematically the erase operation in the sixth embodiment. The nonvolatile semiconductor memory device in the present embodiment is a composite type of the fourth embodiment and the fifth embodiment. That is, when the number of times of executions i of the erase pulse application operation in one erase operation has reached the maximum allowable number $n_{MAX}$, the allowable number $N_{AL}$ is increased from the initial value N1 to N1+γ and the erase verify voltage Vcgerv is also raised from the voltage V2 to the voltage V2+β. As a result, in the sixth embodiment, the judgment criteria for completion of the erase operation in the final erase verify operation are relaxed. That is, it is also possible to perform a relaxation combining the fourth embodiment and the fifth embodiment. Moreover, the sixth embodiment has an advantage combining those of the fourth and fifth embodiments.

Figure 20:
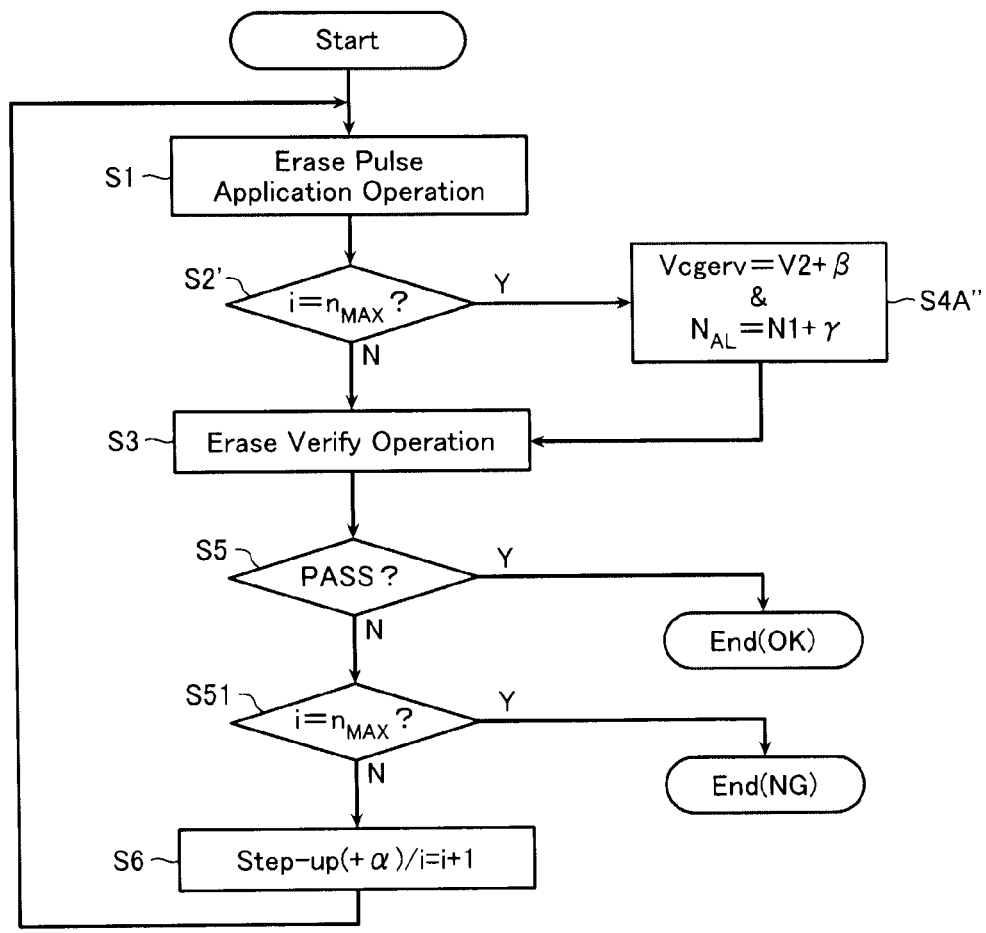
FIG. 20 is a flowchart showing specifically an execution procedure of the erase operation according to the sixth embodiment.

A specific procedure of the erase operation in the sixth embodiment is described using the flowchart of FIG. 20. The difference between the sixth embodiment and the fourth embodiment is step S4A". In step S4A", the size of the allowable number $N_{AL}$ is switched from N1 to N1+γ and the erase verify voltage Vcgerv is also switched from the voltage V2 to the voltage V2+β.

Seventh Embodiment

Next, a nonvolatile semiconductor memory device in a seventh embodiment is described with reference to FIG. 21. A configuration of this nonvolatile semiconductor memory device in the seventh embodiment may be similar to that of the first embodiment. However, content of the erase operation in the seventh embodiment differs from that in the aforementioned embodiments.

Figure 21:
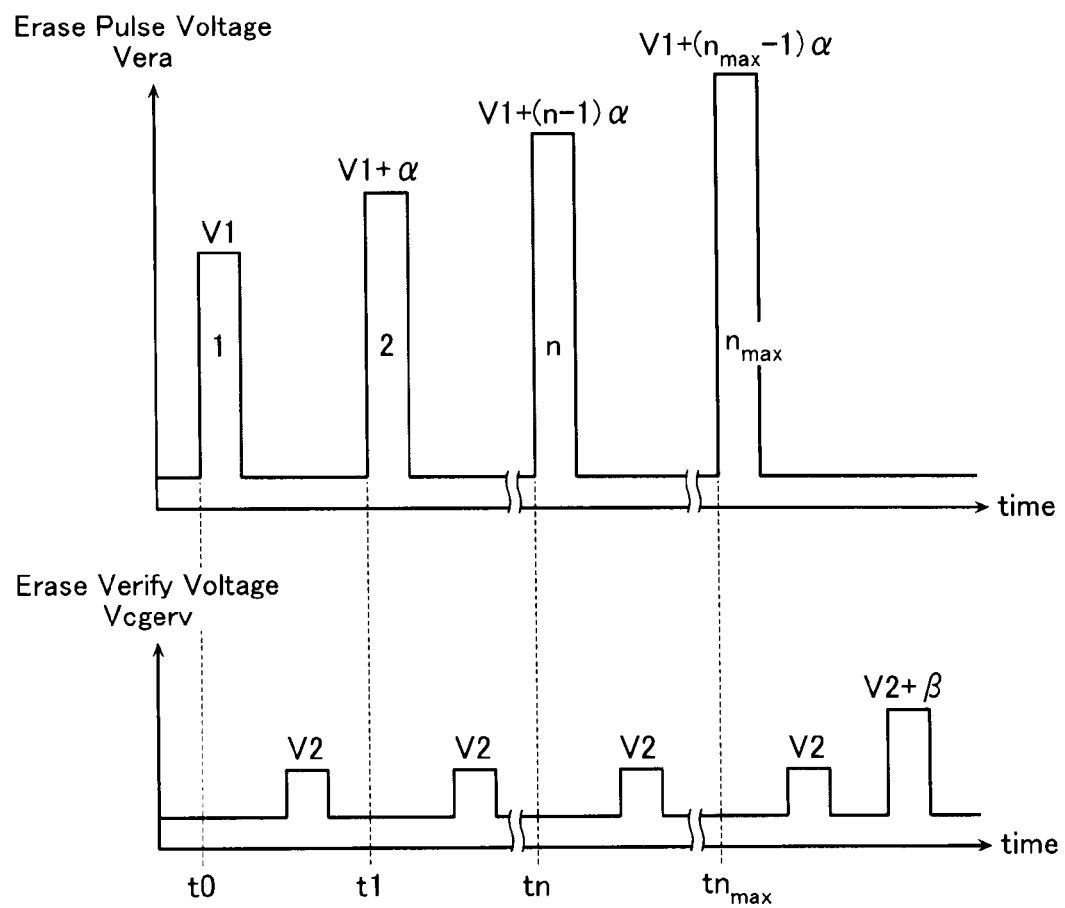
FIG. 21 shows schematically an erase operation according to a seventh embodiment.

FIG. 21 shows schematically the erase operation in the seventh embodiment. Similarly to the above-described embodiments, the nonvolatile semiconductor memory device in the present embodiment repeats the erase pulse application operation and the erase verify operation, a maximum of $n_{MAX}$ times, while stepping up the erase pulse voltage Vera in increments of a voltage α, until "PASS" is attained. Up to the $n_{MAX}$-th time erase verify operation, a constant value V2 is used fixedly for the erase verify voltage Vcgerv.

Then, in the case that completion of the erase operation (PASS) is not detected even by the $n_{MAX}$-th time erase pulse application operation and erase verify operation performed when the number of times of executions i has reached the maximum allowable number $n_{MAX}$, a further and final erase verify operation is executed. At this time, the erase verify voltage Vcgerv is for the first time switched from the voltage V2 to the voltage V2+β. As a result, in the seventh embodiment, judgment criteria for completion of the erase operation are relaxed for the first time in the final erase verify operation.

That is, an operation of the seventh embodiment enables a block judged a defective block to be repaired. For example, when fresh cell single time erase adjustment is performed, memory cells in a block where the number of times of executions i has reached the maximum allowable number $n_{MAX}$ underwent a large number of times of executions of the write/erase operation. Then, a large number of electrons are trapped in the tunnel insulating layer of those memory cells. That is, the upper limit value Vev of the threshold voltage distribution E indicating the erase state shifts substantively in the negative direction. There may be included some memory cells that are not judged as "PASS" in the normal erase verify judgment but should be judged as "PASS" in consideration of the amount of electron stored in the floating gate electrode (pseudo-pass memory cell). Therefore, relaxing the judgment criteria for completion of the erase operation in the final erase verify operation allows pseudo-PASS memory cells to be repaired. Hence, the seventh embodiment allows product lifetime of the nonvolatile semiconductor memory device to be extended.

Figure 22:
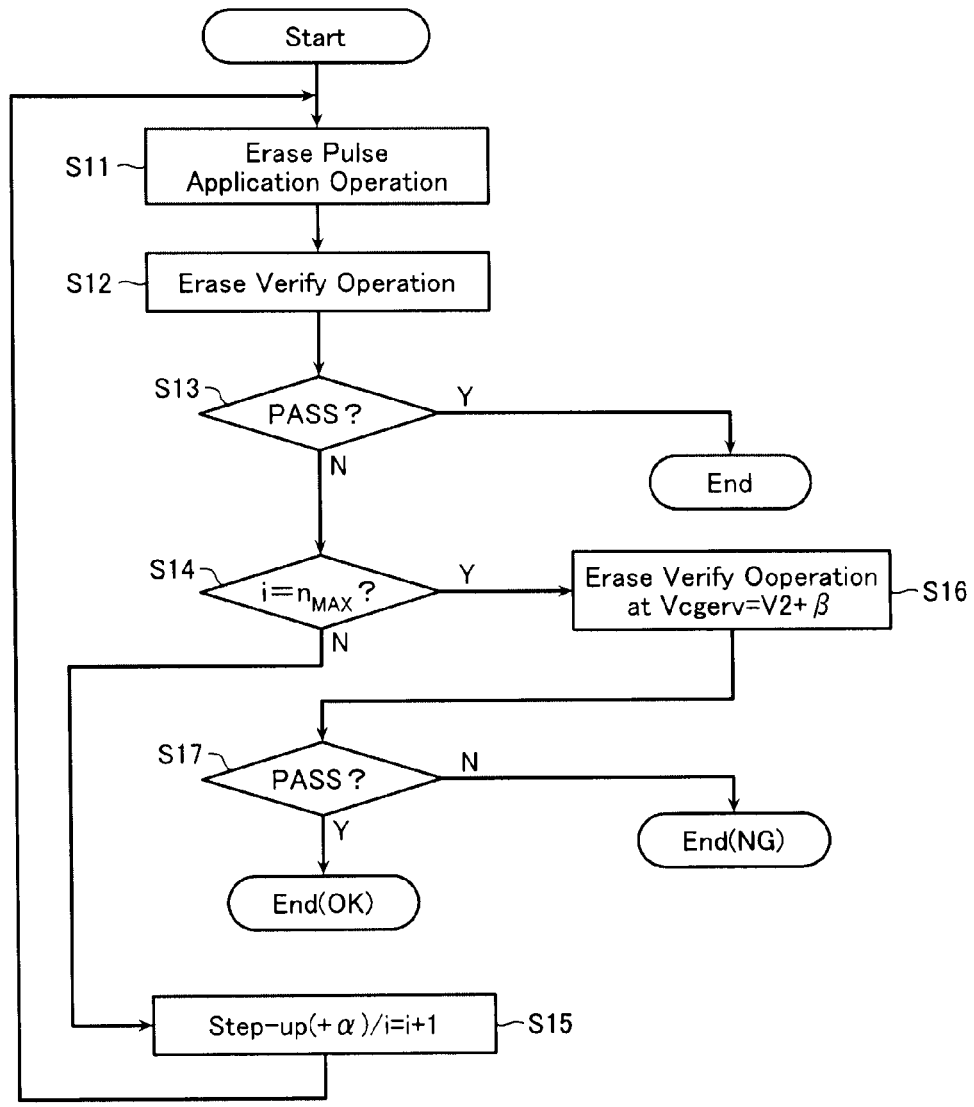
FIG. 22 is a flowchart showing specifically an execution procedure of the erase operation according to the seventh embodiment.

A specific procedure of the erase operation in the seventh embodiment is described using the flowchart of FIG. 22. The controller 4 initially sets the erase pulse voltage Vera to the voltage V1 and the erase verify voltage Vcgerv to the voltage V2, and executes the erase pulse application operation and erase verify operation (S11, S12). Unless "PASS" is judged in an erase verify operation, the erase pulse application operation and erase verify operation are repeated until the number of times of executions i has reached the maximum allowable number $n_{MAX}$ (S13, S14). During that time, the erase pulse voltage Vera in the erase pulse application operation is stepped up by a step-up value α (S15), and the erase verify voltage Vcgerv in the erase verify operation remains fixed at a constant value V2.

Meanwhile, when the $n_{MAX}$-th time erase pulse application operation and erase verify operation have finished and erase completion (PASS) has not been detected even by the $n_{MAX}$-th time erase verify voltage (N in S13, Y in S14), the erase verify voltage Vcgerv is for the first time changed from the voltage V2 to the voltage V2+β, and the final erase verify operation executed (S16). If that final erase verify operation (erase verify voltage Vcgerv=V2+β) results in the erase operation being judged to have been completed (PASS), the erase operation is terminated as erase operation complete (OK) (Y in S17); otherwise, the erase operation is terminated as an erase operation fail (NG) (N in S17).

Eighth Embodiment

Next, a nonvolatile semiconductor memory device in an eighth embodiment is described with reference to FIG. 23. A configuration of this nonvolatile semiconductor memory device in the eighth embodiment may be similar to that of the first embodiment. However, content of the erase operation in the eighth embodiment differs from that in the aforementioned embodiments.

Figure 23:
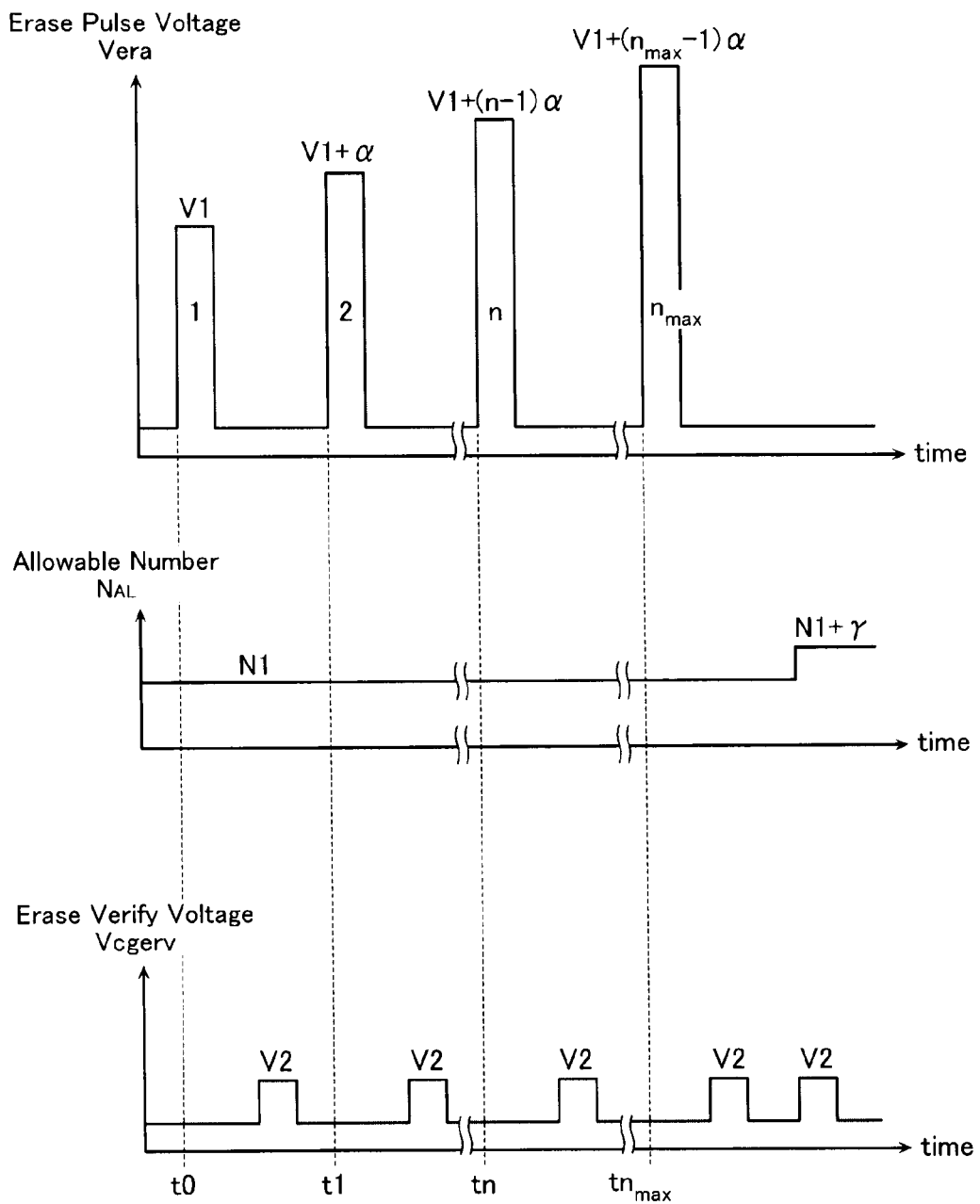
FIG. 23 shows schematically an erase operation according to a eighth embodiment.

FIG. 23 shows schematically the erase operation in the eighth embodiment. Similarly to the seventh embodiment, the nonvolatile semiconductor memory device in the present embodiment repeats the erase pulse application operation and the erase verify operation, a maximum of $n_{MAX}$ times, while stepping up the erase pulse voltage Vera in increments of a voltage α, until "PASS" is attained. Up to the $n_{MAX}$-th time erase verify operation, a constant value V2 is used fixedly for the erase verify voltage Vcgerv.

Then, in the case that completion of the erase operation (PASS) is not detected even by the $n_{MAX}$-th time erase pulse application operation and erase verify operation performed when the number of times of executions i has reached the maximum allowable number $n_{MAX}$, a further and final erase verify operation is executed. At this time, the erase verify voltage Vcgerv remains set at the same voltage V2 as previously, but the allowable number $N_{AL}$ is raised from N1 to N1+γ. As a result, in the eighth embodiment, judgment criteria for completion of the erase operation are relaxed for the first time in the final erase verify operation. It is therefore clear from the descriptions of the first and second embodiments and of the seventh embodiment that a similar advantage to that of the seventh embodiment can be obtained in the eighth embodiment.

Figure 24:
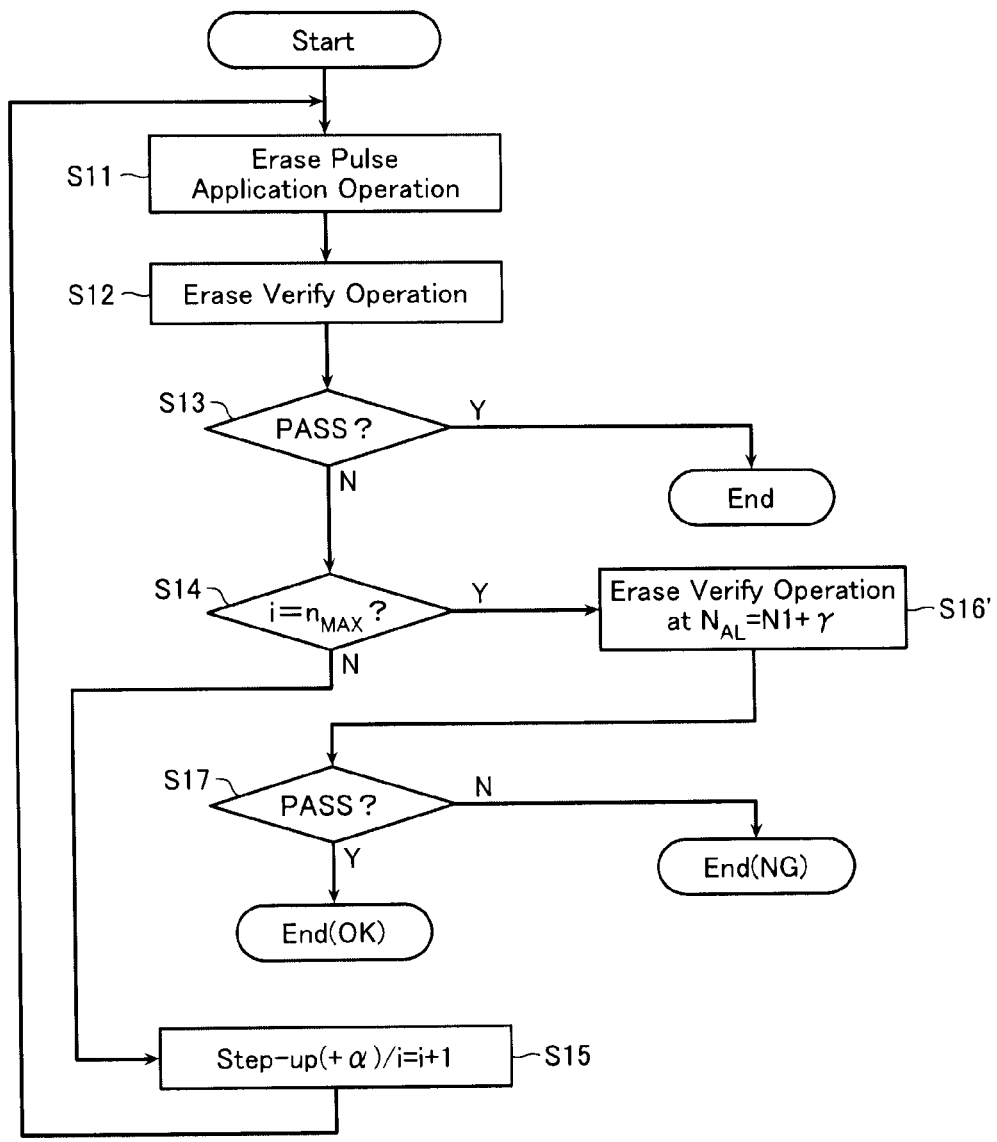
FIG. 24 is a flowchart showing specifically an execution procedure of the erase operation according to the eighth embodiment.

A specific procedure of the erase operation in the eighth embodiment is described using the flowchart of FIG. 24. The difference between the eighth embodiment and the seventh embodiment (FIG. 22) is the execution after changing the allowable number $N_{AL}$ from N1 to N1+γ in S16'.

Ninth Embodiment

Next, a nonvolatile semiconductor memory device in a ninth embodiment is described with reference to FIG. 25. A configuration of this nonvolatile semiconductor memory device in the ninth embodiment may be similar to that of the first embodiment. However, content of the erase operation in the ninth embodiment differs from that in the aforementioned embodiments.

Figure 25:
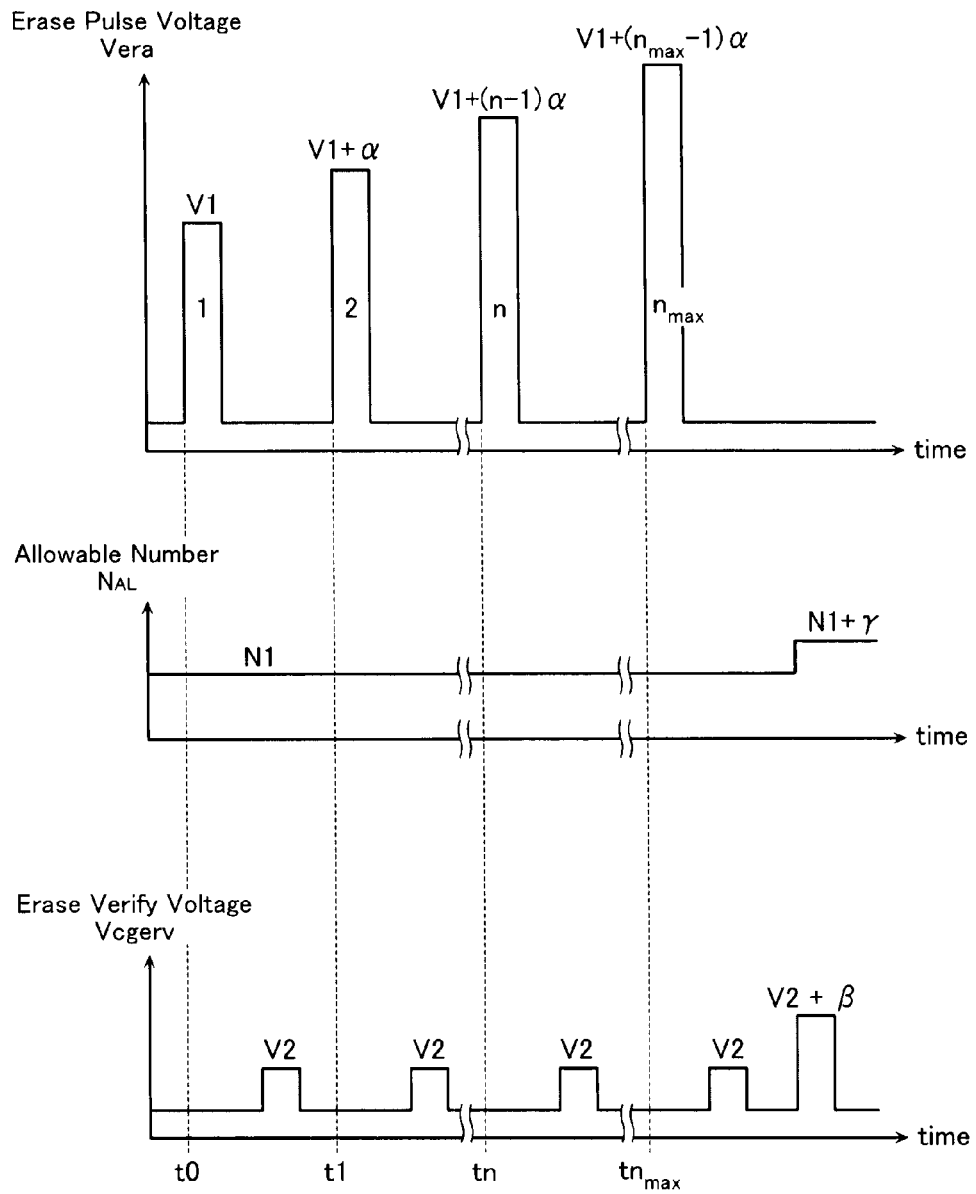
FIG. 25 shows schematically an erase operation according to a ninth embodiment.

FIG. 25 shows schematically the erase operation in the ninth embodiment. The nonvolatile semiconductor memory device in the present embodiment is a composite type of the seventh embodiment and the eighth embodiment. That is, the nonvolatile semiconductor memory device in the present embodiment repeats the erase pulse application operation and the erase verify operation, a maximum of $n_{MAX}$ times, while stepping up the erase pulse voltage Vera in increments of a voltage α, until "PASS" is attained. Up to the $n_{MAX}$-th time erase verify operation, a constant value V2 is used fixedly for the erase verify voltage Vcgerv.

Then, in the case that completion of the erase operation (PASS) is not detected even by the $n_{MAX}$-th time erase pulse application operation and erase verify operation performed when the number of times of executions i has reached the maximum allowable number $n_{MAX}$, a further and final erase verify operation is executed. At this time, the erase verify voltage Vcgerv is switched for the first time from the voltage V2 to the voltage V2+β, and the allowable number of times $N_{AL}$ is switched from N1 to N1+γ. As a result, judgment criteria for completion of the erase operation are relaxed for the first time in the final erase verify operation. This allows an advantage combining those of the seventh and eighth embodiments to be obtained.

Figure 26:
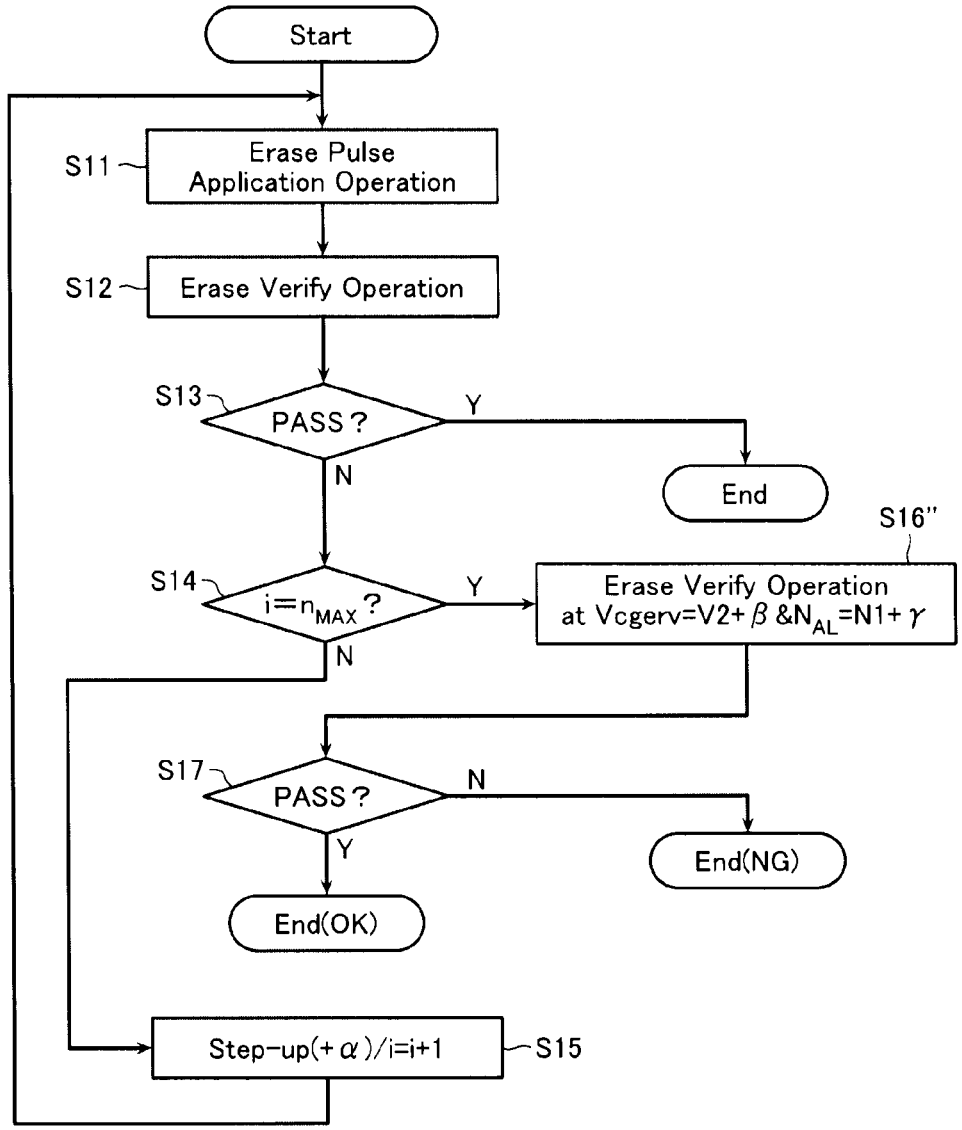
FIG. 26 is a flowchart showing specifically an execution procedure of the erase operation according to the ninth embodiment.

A specific procedure of the erase operation in the ninth embodiment is described using the flowchart of FIG. 26. The difference between the ninth embodiment and the seventh embodiment (FIG. 22) is step S16". In step S16", the size of the allowable number $N_{AL}$ is switched from N1 to N1+γ and the erase verify voltage Vcgerv is also switched from the voltage V2 to the voltage V2+β.

Tenth Embodiment

Figure 27:
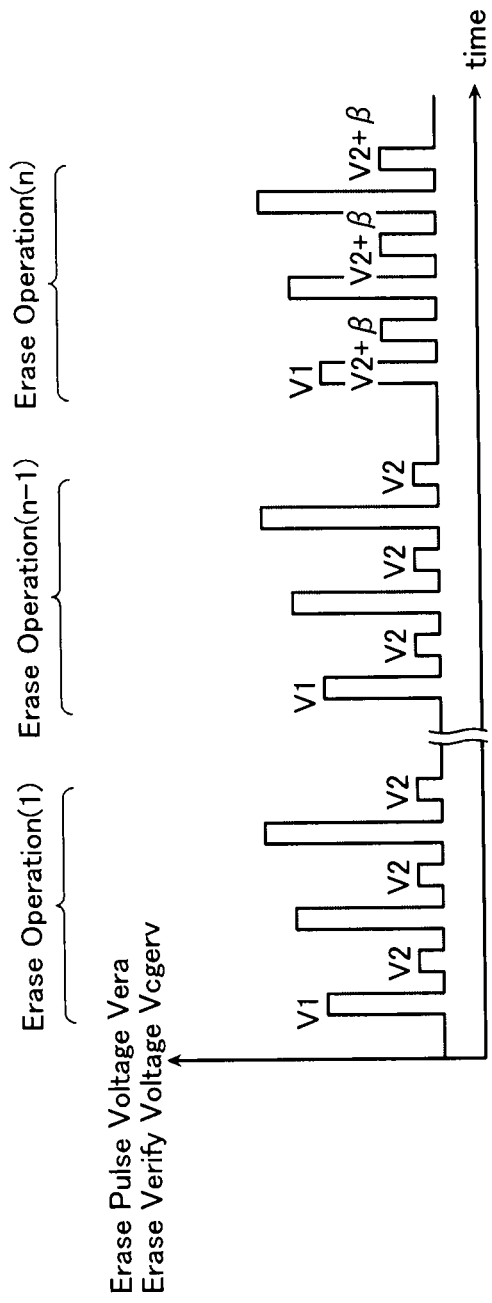
FIG. 27 shows schematically an erase operation according to a tenth embodiment.

Next, a nonvolatile semiconductor memory device in a tenth embodiment is described with reference to FIG. 27. A configuration of this nonvolatile semiconductor memory device in the tenth embodiment may be similar to that of the first embodiment. However, content of the erase operation in the tenth embodiment differs from that in the aforementioned embodiments.

In the tenth embodiment, during the period to completion of one erase operation, the erase verify voltage Vcgerv in the erase verify operation remains set at a constant value, for example, V2. However, in an n-th time erase operation after the write operation/erase operation has been repeated and the number of times of executions $N_{WE}$ of the write operation/erase operation has exceeded a certain number of times, and in erase operations subsequent to this n-th time erase operation, the value of the erase verify voltage Vcgerv is raised to V2+β. This also allows a similar advantage to those of the aforementioned embodiments to be displayed. Note that the number of times of executions $N_{WE}$ may be counted by a counter not shown provided internally in the controller 4. When the write/erase operations are repeated, there exist memory cells having a large number of electrons trapped in the tunnel insulating film of the memory cells. That is, the difference between difficult-to-erase memory cells and comparatively easy-to-be-erased memory cells increases. As a result, it becomes more easy for over-erase of memory cells to occur.

Changing the value of the erase verify voltage Vcgerv according to the number times of executions $N_{WE}$ of the write operation/erase operation makes it possible to prevent the upper skirt of the threshold distribution of memory cells in the erase state becoming too shallow when the number of write/erase operations is small.

Eleventh Embodiment

Next, a nonvolatile semiconductor memory device in an eleventh embodiment is described with reference to FIG. 28. A configuration of this nonvolatile semiconductor memory device in the eleventh embodiment may be similar to that of the first embodiment. However, content of the erase operation in the eleventh embodiment differs from that in the aforementioned embodiments.

The erase pulse application operation in the erase operation of this eleventh embodiment is executed while performing a step-up operation of the erase pulse voltage Vera (+α), similarly to in the aforementioned embodiments.

Figure 28:
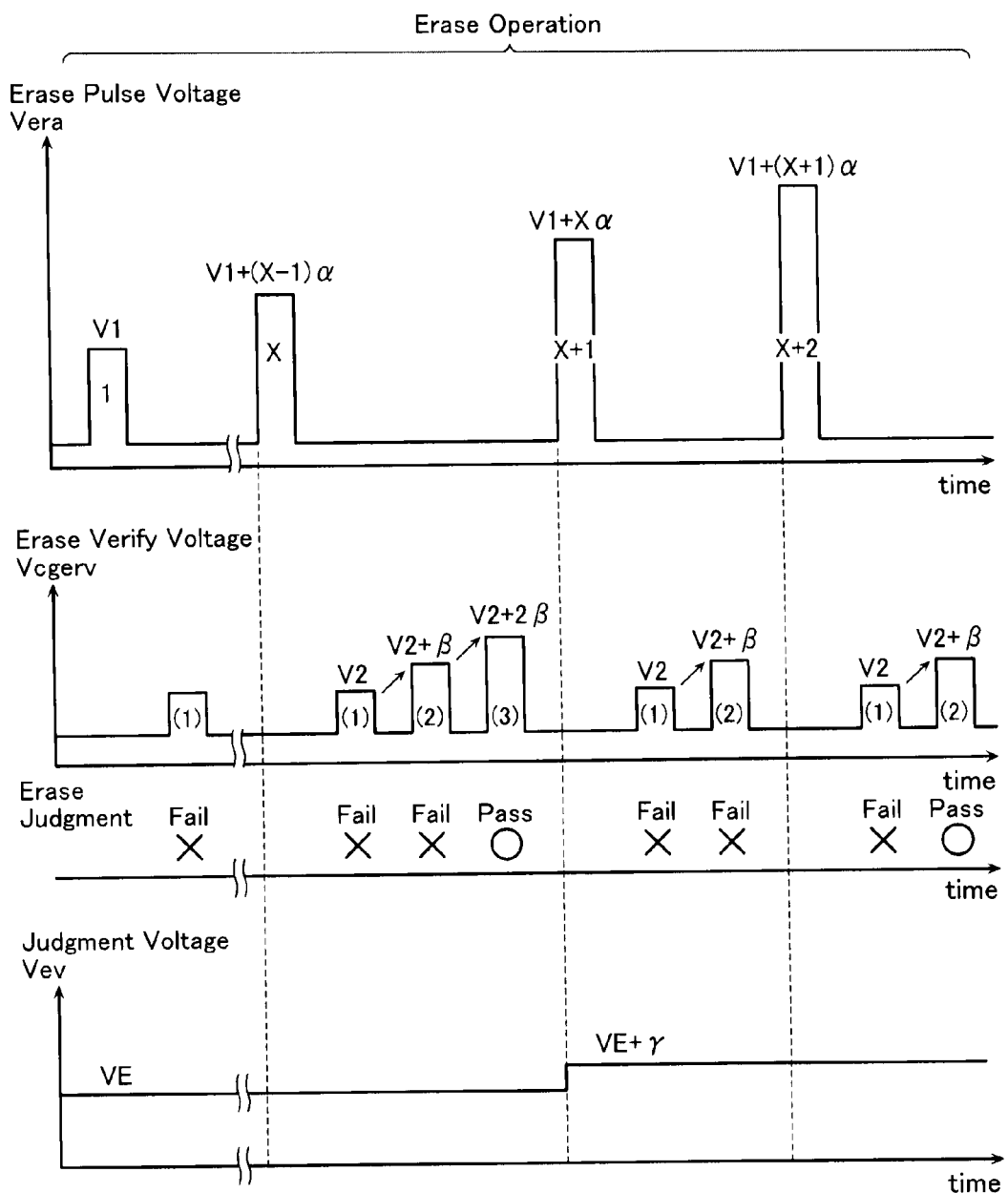
FIG. 28 shows schematically an erase operation according to an eleventh embodiment.

Moreover, as shown in FIG. 28, in the erase operation of the present embodiment, when the number of times of executions i of the erase pulse application operation is under a number of times X, one erase verify operation is executed after one erase pulse application operation (between two erase pulse application operations), similarly to in the above-described embodiments.

On the other hand, as shown in FIG. 28, in the erase operation of the present embodiment, when the number of times of executions i of the erase pulse application operation is the number of times X or more, the erase verify operation is executed multiple times after one erase pulse application operation (between two erase pulse application operations). FIG. 28 shows an example in which, for example, a maximum of three times ((1)-(3)) of the erase verify operation are executed after one erase pulse application operation 1, . . . X, X+1, X+2. Moreover, those three times of the erase verify operation (1)-(3) are executed while raising the erase verify voltage Vcgerv stepwise (for example, in the manner of V2→V2+β→V2+2β.

Then, if a judge of "PASS" is obtained at a verify voltage Vcgerv not more than a judgment voltage Vev in the erase verify operation, the erase operation is judged to have been completed. Furthermore, if a judge of "PASS" is obtained at a verify voltage Vcgerv larger than the judgment voltage Vev, the erase operation is judged to be approaching completion, and the judgment voltage Vev is raised. In the example shown in FIG. 28, an initial value of the judgment voltage Vev is set to a voltage VE.

For example, when the number of times of executions i of the erase pulse application operation is the number of times X or more, the verify voltage Vcgerv is stepped up in the sequence of voltage V2, voltage V2+β, voltage V2+2β. It is assumed here that "PASS" is judged at a verify voltage Vcgerv=V2+2β. In this case, the judgment voltage Vev=VE is thereafter set to the judgment voltage Vev=VE+γ. If, subsequently, "PASS" is judged, for example, at a verify voltage Vcgerv=V2+β using the judgment voltage VE+γ, the erase operation is completed. By performing several kinds of erase verify when the number of times of executions i of the erase pulse application operation has reached the number of times X, this embodiment allows approaching completion of the erase operation to be confirmed and erase judgment criteria to be relaxed. As a result, the threshold voltage distribution of the erase state can be prevented from becoming too shallow.

In addition, when fresh cell single time erase adjustment is performed, the erase operation can be performed at high speed and occurrence of over-erase memory cells can be prevented, in addition to the above-described advantage.

Moreover, in the erase verify operation (3) using an erase verify voltage Vcgerv larger than the judgment voltage Vev in the above-described eleventh embodiment, there may be cases where a "PASS" judgment is achieved at an earlier stage than in the second erase verify operation (2). For example, as shown in FIG. 28, in the three times of the erase verify operation after the first time erase pulse application operation 1, it is possible for the erase verify operations (1) and (2) to be "FAIL", but for a judgment of "PASS" to be made in the erase verify operation (3). In that case, in the next erase verify operation subsequent to the second time or later erase pulse application operations 2, 3, . . . , the erase verify operation (3) is omitted, and only erase verify operations (1) and (2) are executed. Then, the erase pulse application operation and erase verify operation are repeated until "PASS" is judged in the erase verify operation (2) using the judgment voltage Vev=VE+γ. FIG. 28 illustrates an example where "PASS" is judged in the erase verify operation (2) after the third time erase pulse application operation 3, and the erase operation is terminated. Using a judgment voltage VE+γ larger than the judgment voltage VE in this way allows the erase verify operation using the erase verify voltage Vcgerv=V2+2β to be omitted. As a result, time required for the erase operation can be reduced. In addition, the erase pulse Vera is a large voltage of about 15 V-25 V, and the number of times this erase pulse Vera is applied can be reduced. As a result, power consumption of the nonvolatile semiconductor memory device can be reduced.

Figure 29:
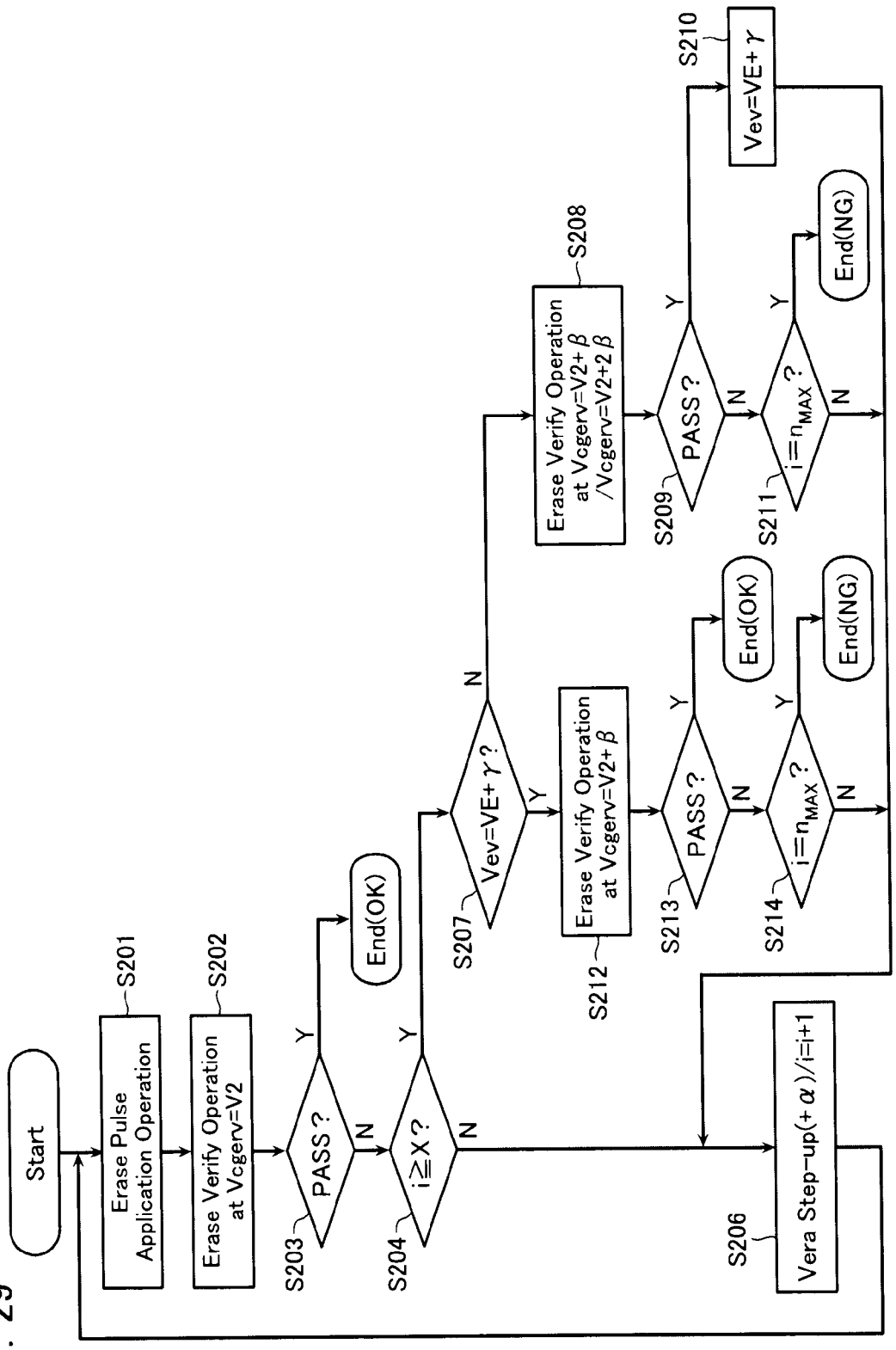
FIG. 29 is a flowchart showing specifically an execution procedure of the erase operation according to the eleventh embodiment.

FIG. 29 is a flowchart showing specifically an execution procedure of the erase operation shown in FIG. 28. In FIG. 29, the controller 4 initially sets the erase pulse voltage Vera to the voltage V1 and the judgment voltage Vev to the voltage VE. As shown in FIG. 29, first, the controller 4 executes the erase pulse application operation (S201).

The erase verify voltage Vcgerv is set to the voltage V2 and the erase verify operation is executed (S202). Next, if the erase operation is judged to have been completed (PASS) by the erase verify operation of step S202 (Y in S203), the erase operation is terminated. On the other hand, if the erase operation is not judged to have been completed by the erase verify operation of step S202 (N in S203), step S204 is next executed.

In step S204, it is judged whether or not the number of times of executions i of the erase pulse application operation in one erase operation is the number of times X or more. If the number of times of executions i of the erase pulse application operation is under X times (N in S204), step S206 is next executed. On the other hand, if the number of times of executions i of the erase pulse application operation is X times or more (Y in S204), step S207 indicated below is executed.

In step S206, the erase pulse voltage Vera is increased by an amount of a step-up value α (S206), and the erase pulse application operation is executed again (S201).

Meanwhile, in step S207, it is judged whether the judgment voltage Vev is the voltage VE+γ or not. Now, if the judgment voltage Vev is the voltage VE (the judgment voltage Vev is not the voltage VE+γ) (N in S207), step S208 is next executed. On the other hand, if the judgment voltage Vev is the voltage VE+γ (Y in S207), step S212 indicated below is executed.

In step S208, the erase verify voltage Vcgerv is stepped up in the sequence of voltages V2+β and V2+2β, and the erase verify operation is executed. Next, when the erase operation is judged to have been completed (PASS) by the erase verify operation using either of the erase verify voltages Vcgerv in step S208 (Y in S209), the judgment voltage Vev is set to the voltage VE+γ (step S210), after which step S206 is executed. On the other hand, when the erase operation is not judged to have been completed by the erase verify operation in step S208 (N in S209), step S211 is next executed.

In step S211, if the number of times of executions i has reached the maximum allowable number $n_{MAX}$ (Y in S211), the erase operation is terminated as a fail (NG). On the other hand, in step S211, if the number of times of executions i has not reached the maximum allowable number $n_{MAX}$ (N in S211), step S206 is executed.

In step S212, the erase verify voltage Vcgerv is set to V2+β and the erase verify operation is executed. Next, if the erase operation is judged to have been completed (PASS) by the erase verify operation in step S212 (Y in S213), the erase operation is terminated. On the other hand, if the erase operation is not judged to have been completed by the erase verify operation in step S212 (N in S213), step S214 is next executed.

In step S214, if the number of times of executions i has reached the maximum allowable number $n_{MAX}$ (Y in S214), the erase operation is terminated as a fail (NG). On the other hand, in step S214, if the number of times of executions i has not reached the maximum allowable number $n_{MAX}$ (N in S214), step S206 is executed.

First Modified Example of Eleventh Embodiment

Figure 30:
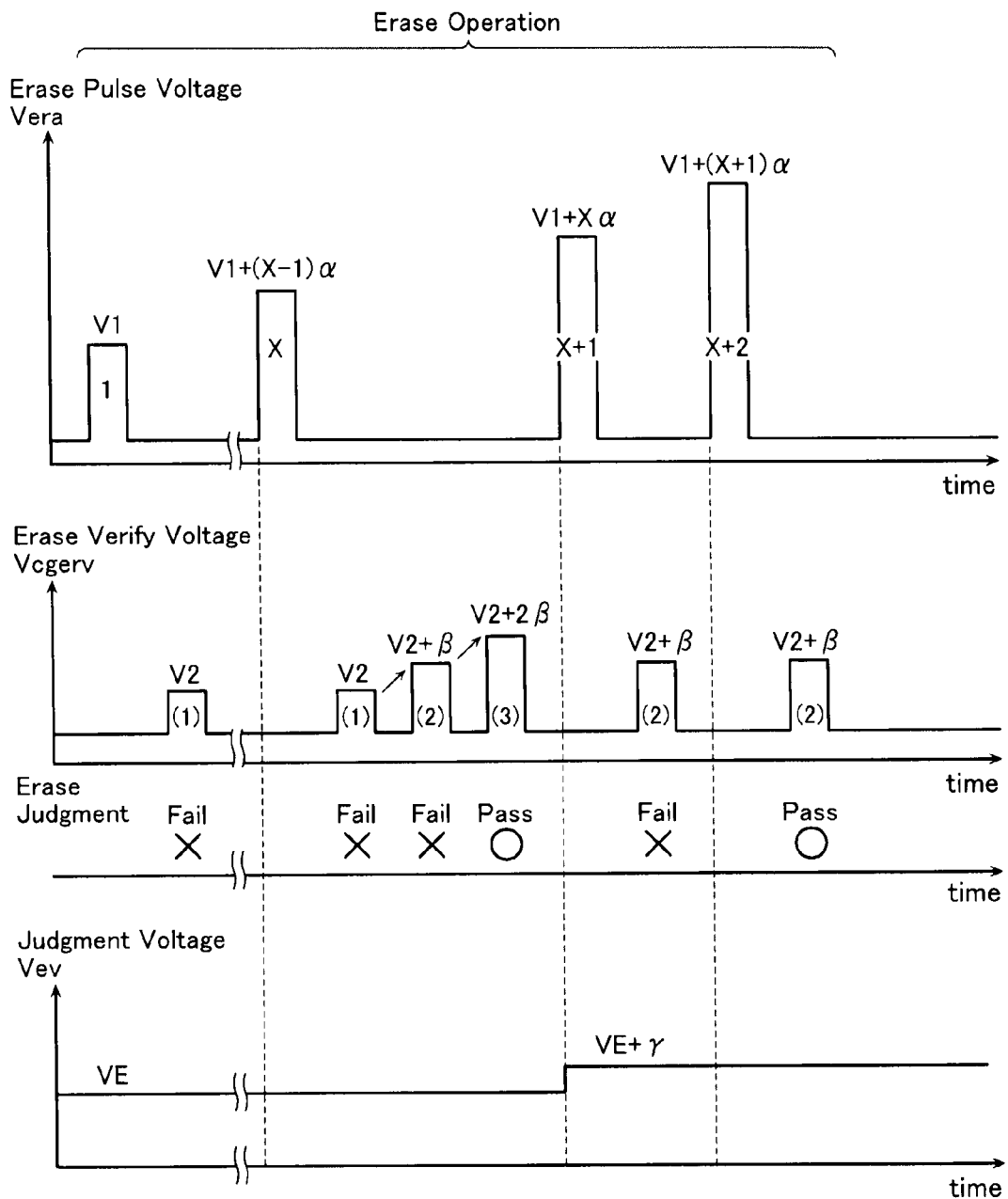
FIG. 30 shows schematically an erase operation according to a modified example of the eleventh embodiment.

Next, a first modified example of the eleventh embodiment is described with reference to FIG. 30. In the eleventh embodiment shown in the above-described FIGS. 28 and 29, first the erase verify operation (1) having the erase verify voltage Vcgerv set to the voltage V2 is executed, and then the erase verify operation (2) having the erase verify voltage Vcgerv set to the voltage V2+β is executed, even after the judgment voltage Vev has been set from the voltage VE to the voltage VE+γ. In contrast, as shown in FIG. 30, in the first modified example of the eleventh embodiment, after the judgment voltage Vev has been set from the voltage VE to the voltage VE+γ, the erase verify operation having the erase verify voltage Vcgerv set to the voltage V2 is omitted, and an erase verify operation (2) having the erase verify voltage Vcgerv set to the voltage V2+β is only executed. Such a control shown in FIG. 30 allows the erase time to be reduced more than a control shown in FIGS. 28 and 29.

Second Modified Example of Eleventh Embodiment

Figure 31:
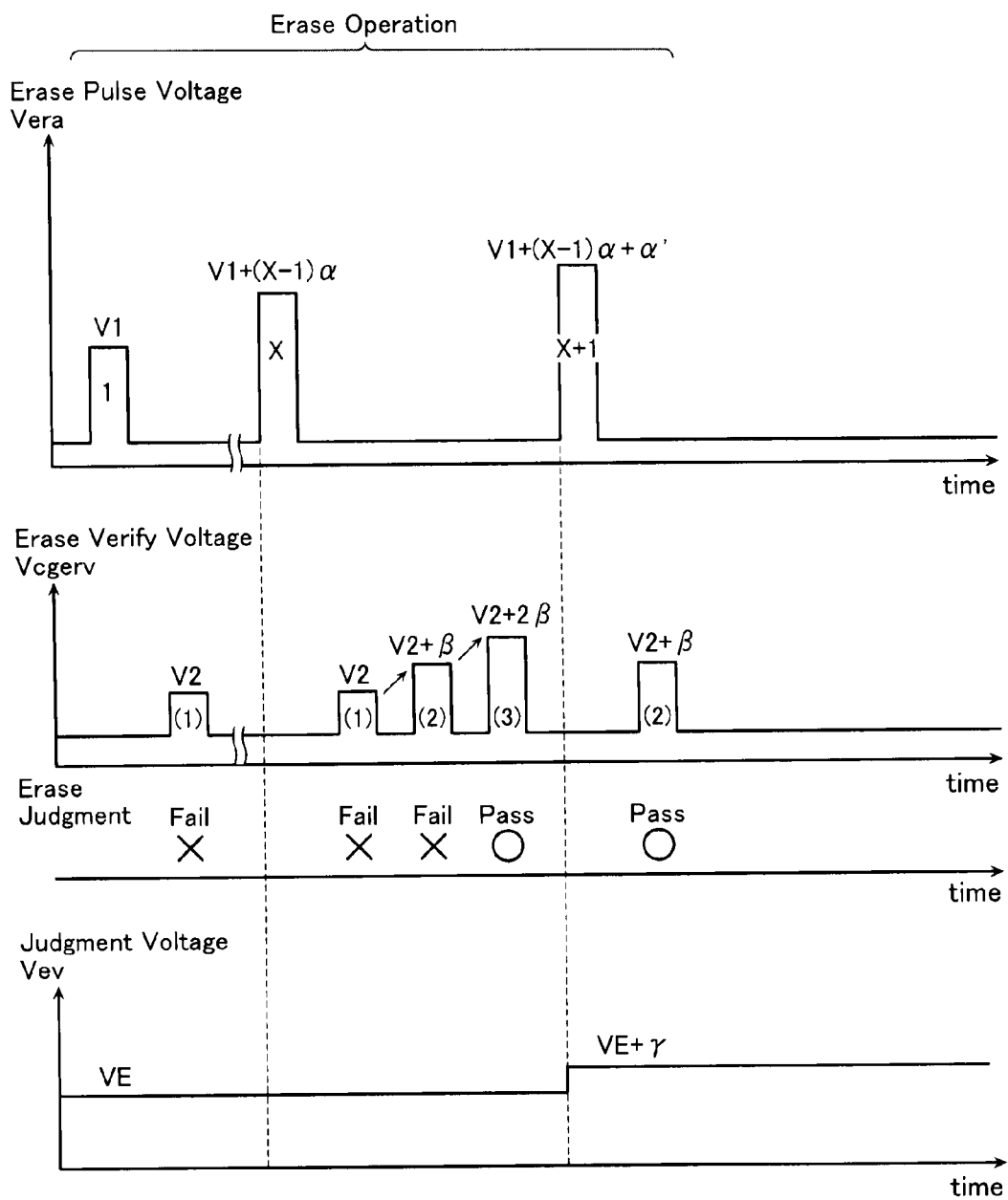
FIG. 31 shows schematically an erase operation according to another modified example of the eleventh embodiment.

Next, a second modified example of the eleventh embodiment is described with reference to FIG. 31. In the eleventh embodiment shown in the above-described FIGS. 28 and 29, the erase pulse voltage Vera is stepped up by an amount of a constant α in accordance with number of times i. In contrast, as shown in FIG. 31, in the second modified example of the eleventh embodiment, after "PASS" has been judged at the erase verify voltage Vcgerv=V2+2β, the erase pulse voltage Vera is stepped up by an amount of a voltage α'(α'<α).

A judgment of PASS based on the erase verify voltage Vcgerv=V2+2β means that completion of the erase operation is approaching. Hence, by reducing the step-up width of the erase pulse voltage from α to α' at the stage where the erase operation is approaching completion as described above, the risk of an over-erase state occurring can be reduced.

Twelfth Embodiment

Figure 32:
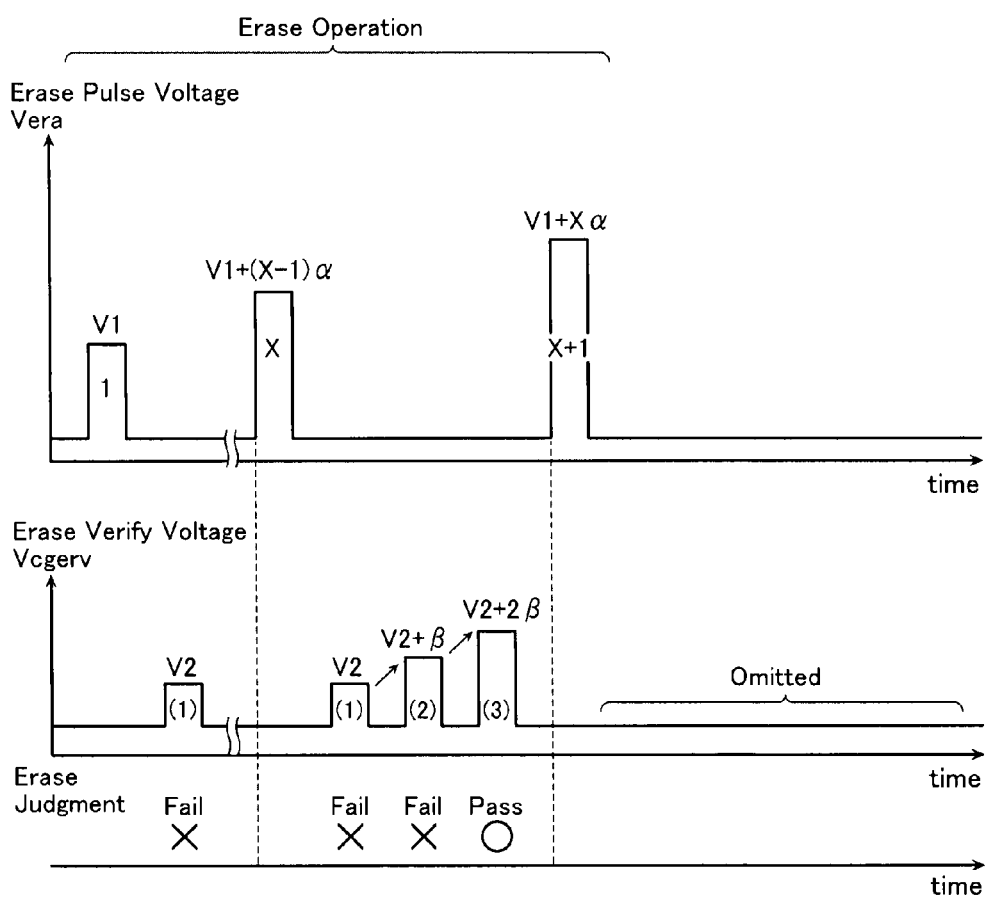
FIG. 32 shows schematically an erase operation according to a twelfth embodiment.

Next, a nonvolatile semiconductor memory device in a twelfth embodiment is described with reference to FIG. 32. A configuration of this nonvolatile semiconductor memory device in the twelfth embodiment may be similar to that of the first embodiment. However, content of the erase operation in the twelfth embodiment differs from that in the aforementioned embodiments.

In this erase operation of the twelfth embodiment, the erase verify operation is executed multiple times after one erase pulse application operation, similarly to in the eleventh embodiment. However, in this twelfth embodiment, when a judge of "PASS" is obtained in the erase verify operation (3) using the erase verify voltage Vcgerv=V2+2β larger than the judgment voltage Vev=VE, the erase pulse application operation is executed once more thereafter, whereby the erase operation is terminated. FIG. 32 shows an example in which the erase verify operation (3) subsequent to the erase pulse application operation X is judged a "PASS", hence although the subsequent erase pulse application operation X+1 is executed, the erase operation is terminated without an erase verify operation being executed after the erase pulse application operation X+1 (erase verify operation omitted). The erase pulse application operation X+1 enables such an operation mode to be executed when "PASS" is attained even in an erase verify operation using the erase verify voltage Vcgerv=V2+β having a judgment voltage Vev=VE+γ, and allows time required for the erase operation to be reduced.

Other Embodiments

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

For example, as shown in FIG. 4, in the above-described embodiments, the erase verify voltage Vcgerv is applied to all word lines WL in the block BLK to execute the erase verify operation. However, as shown in FIGS. 33-36, the erase verify voltage Vcgerv may be applied only to a portion of the word lines WL in the block BLK during the erase verify operation to execute the erase verify operation.

Figure 33:
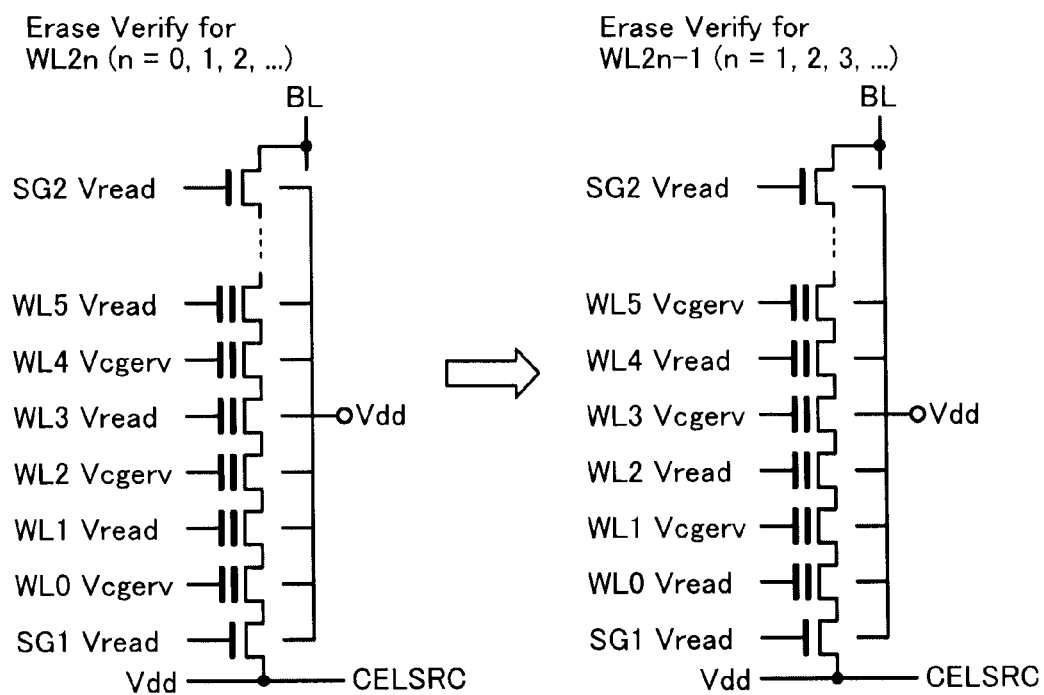
FIG. 33 is a view showing a relationship of voltages applied to a NAND cell unit 10 during an erase verify operation according to another embodiment.

In FIG. 33, first, even-numbered word lines WL2n (n=0, 1, 2, . . . ) counting from the source line CELSRC side are applied with the erase verify voltage Vcgerv, and odd-numbered word lines WL2n−1 (n=1, 2, 3, . . . ) are applied with the read voltage Vread. That is, the erase verify operation is executed targeting only even-numbered memory cells MC. Subsequently, odd-numbered word lines WL2n−1 (n=1, 2, 3, . . . ) are applied with the erase verify voltage Vcgerv, and even-numbered word lines WL2n (n=0, 1, 2, . . . ) are applied with the read voltage Vread. That is, the erase verify operation is executed targeting only odd-numbered memory cells MC. As described above, in the example shown in FIG. 33, the erase verify operation on the memory cells MC in one block BLK is executed divided into two times. As a result, the example shown in FIG. 33 can execute the erase verify operation more accurately than the aforementioned embodiments that execute the erase verify operation on all memory cells MC in one block BLK. Note that the erase verify operation targeting even-numbered memory cells MC may be executed after the erase verify operation targeting odd-numbered memory cells MC.

Figure 34:
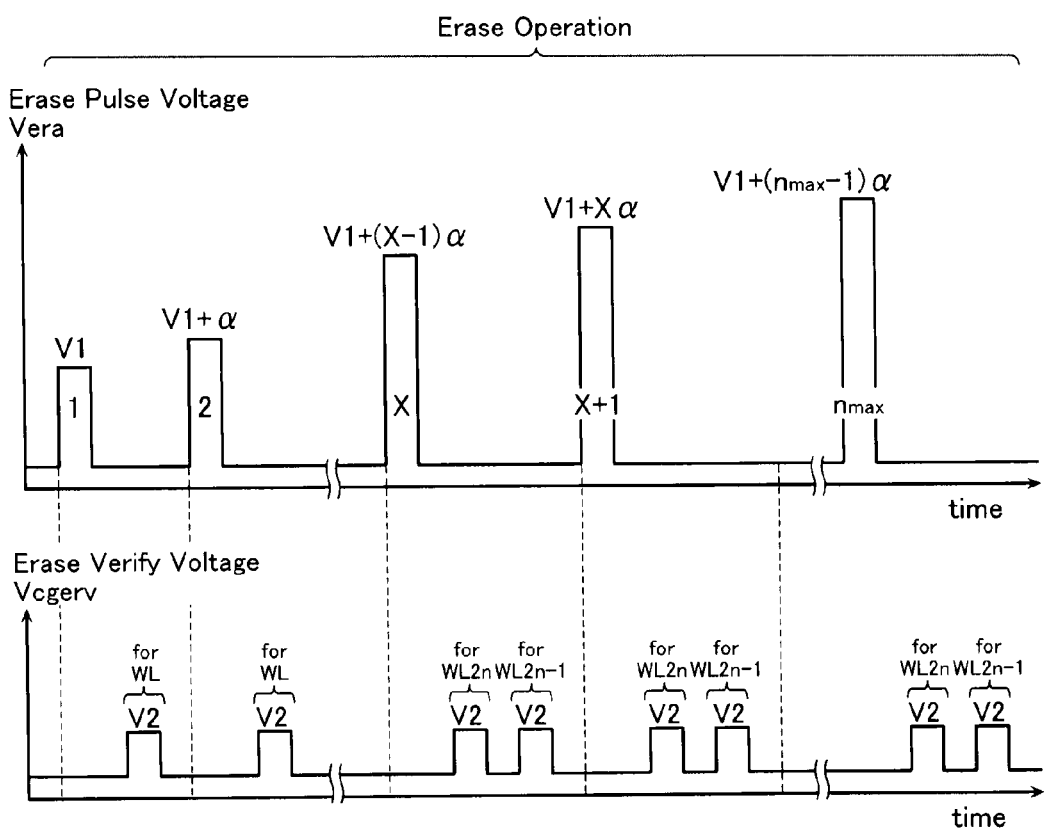
FIG. 34 shows schematically an erase operation using the erase verify operation in FIG. 33.

As shown in FIG. 34, the erase verify operation shown in FIG. 33 may be configured to be applied only after the number of times of executions i of the erase pulse application operation has reached the certain number of times X. In this case, the erase verify voltage Vcgerv may be set at the constant voltage V2, irrespective of the number of times i. Now, after the write operation/erase operation, it may become difficult for the erase verify operation to be judged a "PASS" due to electrons trapped in the tunnel insulating film (sometimes referred to as "parasitic cell effect"). Regarding this, by performing the erase verify operation alternately on odd-numbered/even-numbered memory cells MC, the parasitic cell effect can be reduced. That is, a selected word line WL connected to a memory cell subject to the erase verify operation is applied with the erase verify voltage Vcgerv, while an unselected word line WL adjacent to the selected word line WL is applied with the read voltage Vread larger than the erase verify voltage Vcgerv. As a result, the influence of the parasitic cell effect can be reduced and the memory cell MC can more easily be rendered conductive.

Figure 35:
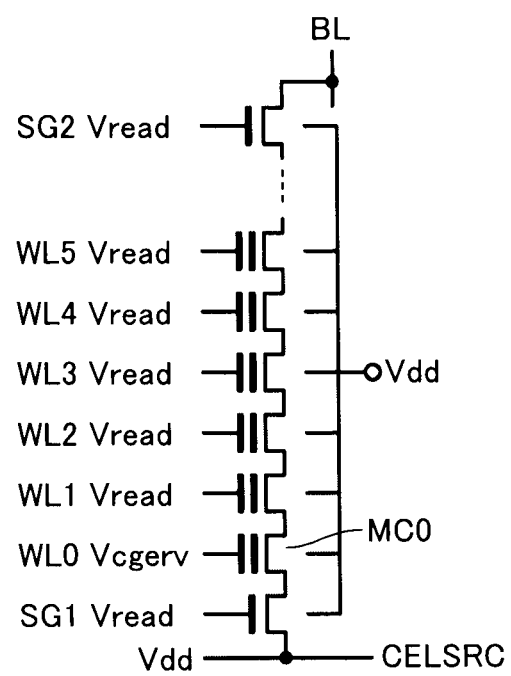
FIG. 35 is a view showing a relationship of voltages applied to a NAND cell unit 10 during an erase verify operation according to another embodiment.

In FIG. 35, the word line WL0 nearest to the source line CELSRC is applied with the erase verify voltage Vcgerv, and other word lines WL1, WL2, . . . are applied with the read voltage Vread. That is, the erase verify operation is executed targeting only the memory cell MC0 nearest to the source line CELSRC. The write operation in a NAND-type flash memory is generally commenced sequentially from the memory cell MC0 nearest to the source line CELSRC. In this case, the memory cell MC0 connected to the word line WL0 is more frequently subject to stress due to the write operation than the other memory cells MC1-31, and there are often a larger number of electrons trapped in the tunnel insulating film of the memory cell MC0 connected to the word line WL0 than in the tunnel insulating films of the other memory cells even when storing the same data. That is, the memory cell MC0 will not be judged a "PASS" in the erase verify operation, unless erased to a deeper position than the other memory cells MC1-31 (unless more electrons present in the floating gate electrode are extracted than in the other memory cells). Under these circumstances, when an erase operation such as in the example shown in FIG. 35 is executed, stress applied to the tunnel insulating film in the memory cell MC0 connected to the word line WL0 can be reduced.

Figure 36:
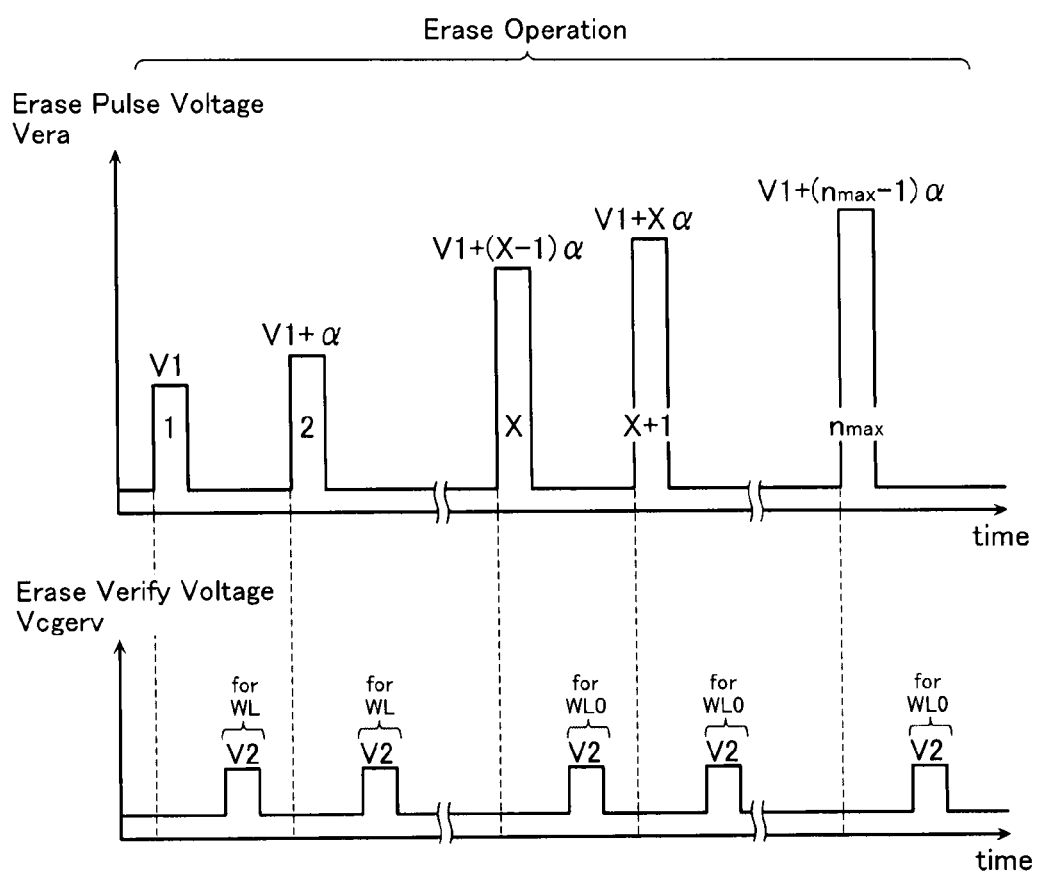
FIG. 36 shows schematically an erase operation using the erase verify operation in FIG. 35.

As shown in FIG. 36, the erase verify operation shown in FIG. 35 may be configured to be applied only after the number of times of executions i of the erase pulse application operation has reached the certain number of times X. In this case, the erase verify voltage Vcgerv may be set at the constant voltage V2, irrespective of the number of times i. In addition, by performing the erase verify operation on all of the memory cells MC0-31 including the memory cell MC0 after "PASS" is achieved in erase verify of the memory cell MC0 connected to the word line WL0, it can be confirmed that all the memory cells are in the erase state. Moreover, after the memory cell MC0 connected to the word line WL0 is judged a "PASS" by the erase verify operation, the erase verify operation may also be performed by applying the read voltage Vread to the word line WL0 connected to the memory cell MC0 and applying the erase verify voltage Vcgerv to the other memory cells MC0-31. As a result, it can be confirmed that all the memory cells are in the erase state. Furthermore, by having the memory cell MC0 applied with the read voltage Vread which is a comparatively high voltage, the influence of the parasitic cell effect can be reduced and the memory cell MC can more easily be rendered conductive.

What is claimed is:

1. A nonvolatile semiconductor memory device comprising:
   a memory cell array configured having a plurality of NAND cell units arranged therein, each NAND cell unit configured having a plurality of memory cells connected in series, each memory cell configured capable of storing an erase state in which data is erased from a memory cell and a write state in which data is written to a memory cell;
   a plurality of word lines connected to the plurality of memory cells, respectively; and a control circuit, the control circuit being configured to execute an erase operation that includes an erase pulse application operation configured to apply an erase pulse voltage to a memory cell to change a memory cell from the write state to the erase state and an erase verify operation configured to apply an erase verify voltage to a memory cell to judge whether a memory cell is in the erase state or not, and the control circuit being configured capable of repeatedly executing the erase pulse application operation multiple times while increasing a voltage value of the erase pulse voltage, until it is judged by the erase verify operation that the erase operation is completed, the control circuit being configured such that, when a number of times of executions of the erase pulse application operation in one erase operation reaches a first number, the control circuit raises a value of the erase verify voltage in the erase verify operation, and the control circuit being configured to apply a voltage not smaller than 0 V to the plurality of word lines in the erase verify operation.

2. A nonvolatile semiconductor memory device comprising:

a memory cell array configured having a plurality of NAND cell units arranged therein, each NAND cell unit configured having a plurality of memory cells connected in series, each memory cell configured capable of storing an erase state in which data is erased from a memory cell and a write state in which data is written to a memory cell; and a control circuit, the control circuit being configured to execute an erase operation that includes an erase pulse application operation configured to apply an erase pulse voltage to a memory cell to change a memory cell from the write state to the erase state and an erase verify operation configured to apply an erase verify voltage to a memory cell to judge whether a memory cell is in the erase state or not, wherein the control circuit is configured capable of repeatedly executing the erase pulse application operation multiple times while increasing a voltage value of the erase pulse voltage, until it is judged by the erase verify operation that the erase operation is completed, the control circuit is configured such that, when a number of NAND cell units judged by the erase verify operation to be not in the erase state becomes an allowable number or less, the control circuit terminates the erase operation, and the control circuit is configured such that, when a number of times of executions of the erase pulse application operation in one erase operation reaches a first number, the control circuit increases the allowable number.

3. The nonvolatile semiconductor memory device according to claim 1, wherein the control circuit is configured such that, when a number of NAND cell units judged by the erase verify operation to be not in the erase state becomes an allowable number or less, the control circuit terminates the erase operation, and the control circuit is configured such that, when the number of times of executions of the erase pulse application operation in one erase operation reaches the first number, the control circuit increases the allowable number.

4. The nonvolatile semiconductor memory device according to claim 1, wherein the first number is a maximum number that the erase pulse application operation is capable of being repeated.

5. The nonvolatile semiconductor memory device according to claim 1, wherein the control circuit is configured such that, when executing the erase verify operation, the control circuit executes a first erase verify operation on one of odd-numbered memory cells and even-numbered memory cells in the NAND cell unit, and then executes a second erase verify operation on another one of odd-numbered memory cells and even-numbered memory cells in the NAND cell unit.

6. The nonvolatile semiconductor memory device according to claim 1, wherein the control circuit executes the erase verify operation on only a specific memory cell in the NAND cell unit.

7. A nonvolatile semiconductor memory device comprising:

a memory cell array configured having a plurality of NAND cell units arranged therein, each NAND cell unit configured having a plurality of memory cells connected in series, each memory cell configured capable of storing an erase state in which data is erased from a memory cell and a write state in which data is written to a memory cell; and a control circuit, the control circuit being configured to execute an erase operation that includes an erase pulse application operation configured to apply an erase pulse voltage to a memory cell to change a memory cell from the write state to the erase state and an erase verify operation configured to apply an erase verify voltage to a memory cell to judge whether a memory cell is in the erase state or not, wherein after a number of times of executions of the erase pulse application operation in one erase operation reaches a first number, the control circuit executes the erase verify operation multiple times while raising a value of the erase verify voltage between two erase pulse voltage application operations.

8. The nonvolatile semiconductor memory device according to claim 7, wherein the control circuit is configured such that, when a memory cell is judged to be in the erase state under an erase verify voltage that is not more than a judgment voltage, the control circuit judges that the erase operation is completed.

9. The nonvolatile semiconductor memory device according to claim 8, wherein the control circuit is configured such that, every time a memory cell is judged to be in the erase state, the control circuit raises a voltage value of the judgment voltage.

10. The nonvolatile semiconductor memory device according to claim 7, wherein the control circuit is configured such that, when a memory cell is judged to be in the erase state in a k-th erase verify operation (k is a natural number) among multiple times of the erase verify operations between two erase pulse voltage application operations, the control circuit omits the k-th erase verify operation from the multiple times of the erase verify operations executed after the two erase pulse voltage application operations.

11. The nonvolatile semiconductor memory device according to claim 7, wherein when a memory cell is judged to be in the erase state in a plurality of first erase verify operations, the control circuit executes the erase pulse application operation, and then, executes a plurality of second erase verify operations, and the control circuit raises the erase verify voltage in a beginning of the plurality of second erase verify operations to a value larger than a verify voltage in a beginning of the plurality of first erase verify operations.

12. The nonvolatile semiconductor memory device according to claim 7, wherein the control circuit is configured capable of repeatedly executing the erase pulse application operation multiple times while increasing a voltage value of the erase pulse voltage, until it is judged by the erase verify operation that the erase operation is completed, and the control circuit is configured such that, each time a memory cell is judged to be in the erase state, the control circuit decreases an amount of increase in the erase pulse voltage.

* * * * *